(12) United States Patent
Shiraishi et al.

(10) Patent No.: US 10,372,041 B2
(45) Date of Patent: Aug. 6, 2019

(54) TARGET GENERATION DEVICE AND EXTREME ULTRAVIOLET LIGHT GENERATION DEVICE

(71) Applicant: Gigaphoton Inc., Tochigi (JP)

(72) Inventors: Yutaka Shiraishi, Oyama (JP); Toshihiro Nishisaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/261,329

(22) Filed: Jan. 29, 2019

(65) Prior Publication Data

US 2019/0155163 A1    May 23, 2019

Related U.S. Application Data

(63) Continuation of application No. PCT/JP2016/075832, filed on Sep. 2, 2016.

(51) Int. Cl.
*H05G 2/00* (2006.01)
*G03F 7/20* (2006.01)

(52) U.S. Cl.
CPC ............ *G03F 7/70033* (2013.01); *G03F 7/20* (2013.01); *H05G 2/00* (2013.01); *H05G 2/008* (2013.01)

(58) Field of Classification Search
CPC .................................................... H05G 2/006
See application file for complete search history.

(56) References Cited

U.S. PATENT DOCUMENTS

| 7,122,816 B2 * | 10/2006 | Algots ................... H05G 2/003 250/504 R |
| 2006/0145022 A1 * | 7/2006 | Buehler ................. B64G 1/402 244/172.2 |
| 2012/0280148 A1 * | 11/2012 | Loopstra ................ H05G 2/003 250/492.1 |
| 2016/0165708 A1 | 6/2016 | Nishisaka et al. |

FOREIGN PATENT DOCUMENTS

| JP | H04-100526 A | 4/1992 |
| JP | 2005-169312 A | 6/2005 |
| JP | 2005-268461 A | 9/2005 |
| WO | 2015/040674 A1 | 3/2015 |

OTHER PUBLICATIONS

International Search Report issued in PCT/JP2016/075832; dated Nov. 29, 2016.
International Preliminary Report on Patentability and Written Opinion issued in PCT/JP2016/075832; dated Mar. 5, 2019.

* cited by examiner

*Primary Examiner* — Nicole M Ippolito
*Assistant Examiner* — Sean M Luck
(74) *Attorney, Agent, or Firm* — Studebaker & Brackett PC

(57) ABSTRACT

A target generation device according to one aspect of the present disclosure includes a tank for containing a target substance, a heater provided at the tank, a nozzle communicating with the inside of the tank, a lid having a gas inlet port communicating with the inside of the tank, and a plurality of shielding plates that are disposed inside the tank and suppress entry of the target substance to the gas inlet port. Each of the shielding plates includes at least one non-shielding region for allowing the gas to pass through. The non-shielding regions of at least two of the shielding plates are arranged at positions in which one of the non-shielding regions of the at least two of the shielding plates is not seen into the other of the non-shielding regions of the at least two of the shielding plates.

19 Claims, 16 Drawing Sheets

TARGET GENERATION DEVICE AND EXTREME ULTRAVIOLET LIGHT GENERATION DEVICE

CROSS-REFERENCE TO RELATED APPLICATIONS

The present application is a continuation application of International Application No. PCT/JP2016/075832 filed on Sep. 2, 2016. The content of the application is incorporated herein by reference in its entirety.

BACKGROUND

1. Technical Field

The present disclosure relates to a target generation device and an extreme ultraviolet light generation device.

2. Related Art

In recent years, along with microfabrication in the semiconductor manufacturing process, fine transfer patterns in photolithography of the semiconductor manufacturing process have been developed rapidly. In the next generation, microfabrication of 20 nm or smaller will be required. Accordingly, it is expected to develop an exposure device in which a device for generating extreme ultraviolet (EUV) light having a wavelength of about 13 nm and a reflection reduction projection optical system are combined.

As EUV light generation devices, three types of devices are proposed, namely, a laser produced plasma (LPP) type device that uses plasma generated when a target material is irradiated with laser light, a discharge produced plasma (DPP) type device that uses plasma generated by discharging, and a synchrotron radiation (SR) type device that uses orbital radiation light.

CITATION LIST

Patent Literature

Patent Literature 1: International Publication No. WO 2015/040674
Patent Literature 2: Japanese Patent Application Laid-Open No. 2005-268461

SUMMARY

A target generation device according to one aspect of the present disclosure includes a tank, a heater, a nozzle, a lid, and a plurality of shielding plates. The tank is configured to contain a target substance. The heater is provided at the tank and is configured to melt the target substance. The nozzle communicates with an inside of the tank and is configured to output the target substance. The lid has a gas inlet port communicating with the inside of the tank. The shielding plates are disposed inside the tank and are configured to suppress entry of the target substance to the gas inlet port. Each of the shielding plates has at least one non-shielding region configured to allow gas to pass through. The non-shielding regions of at least two of the shielding plates are arranged at positions in which one of the non-shielding regions of the at least two of the shielding plates is not seen into the other of the non-shielding regions of the at least two of the shielding plates.

An extreme ultraviolet light generation device according to another aspect of the present disclosure includes a chamber and a target generation device. Plasma is generated inside of the chamber. The target generation device is configured to feed a droplet of a target substance serving as a source of generating the plasma, to the inside of the chamber. The droplet having been fed into the chamber by the target generation device is irradiated with laser light and is made into plasma, and generates extreme ultraviolet light. The target generation device includes a tank, a heater, a nozzle, a lid, and a plurality of shielding plates. The tank is configured to contain a target substance. The heater is provided at the tank and is configured to melt the target substance. The nozzle communicates with an inside of the tank and is configured to output the target substance. The lid has a gas inlet port communicating with the inside of the tank. The shielding plates are disposed inside the tank and are configured to suppress entry of the target substance to the gas inlet port. Each of the shielding plates includes at least one non-shielding region configured to allow gas to pass through. The non-shielding regions of at least two of the shielding plates are arranged at positions in which one of the non-shielding regions of the at least two of the shielding plates is not be seen into the other of the non-shielding regions of the at least two of the shielding plates.

BRIEF DESCRIPTION OF THE DRAWINGS

Some embodiments of the present disclosure will be described below as just examples with reference to the accompanying drawings.

EMBODIMENTS

Contents
1. Overall description of extreme ultraviolet light generation system
   1.1 Configuration
   1.2 Operation
2. Terms
3. Description of extreme ultraviolet light generation device including target generation device
   3.1 Configuration
   3.2 Operation
4. Problem
5. First Embodiment
   5.1 Configuration
   5.2 Operation
   5.3 Effect
6. Second Embodiment
   6.1 Configuration
   6.2 Operation
   6.3 Effect
7. Third Embodiment
   7.1 Configuration
   7.2 Operation
   7.3 Effect
8. Fourth Embodiment
   8.1 Configuration
   8.2 Operation
   8.3 Effect
9. Fifth Embodiment
   9.1 Configuration
   9.2 Operation
   9.3 Effect
10. Sixth Embodiment
   10.1 Configuration
   10.2 Operation
   10.3 Effect
11. Seventh Embodiment
   11.1 Configuration
   11.2 Operation
   11.3 Effect
12. Eighth Embodiment
   12.1 Configuration
   12.2 Operation
   12.3 Effect
13. Ninth Embodiment
   13.1 Configuration
   13.2 Operation
   13.3 Effect
14. Tenth Embodiment
   14.1 Configuration
   14.2 Operation
   14.3 Effect
15. Eleventh Embodiment
   15.1 Configuration
   15.2 Operation
   15.3 Effect
16. Modifications of Embodiments Hereinafter, embodiments of the present disclosure will be described in detail with reference to the drawings.

The embodiments described below illustrate some examples of the present disclosure, and do not limit the contents of the present disclosure. All of the configurations and the operations described in the embodiments are not always indispensable as configurations and operations of the present disclosure. The same constituent elements are denoted by the same reference signs, and overlapping description is omitted.

1. Overall Description of Extreme Ultraviolet Light Generation System

1.1 Configuration

Figure 1:
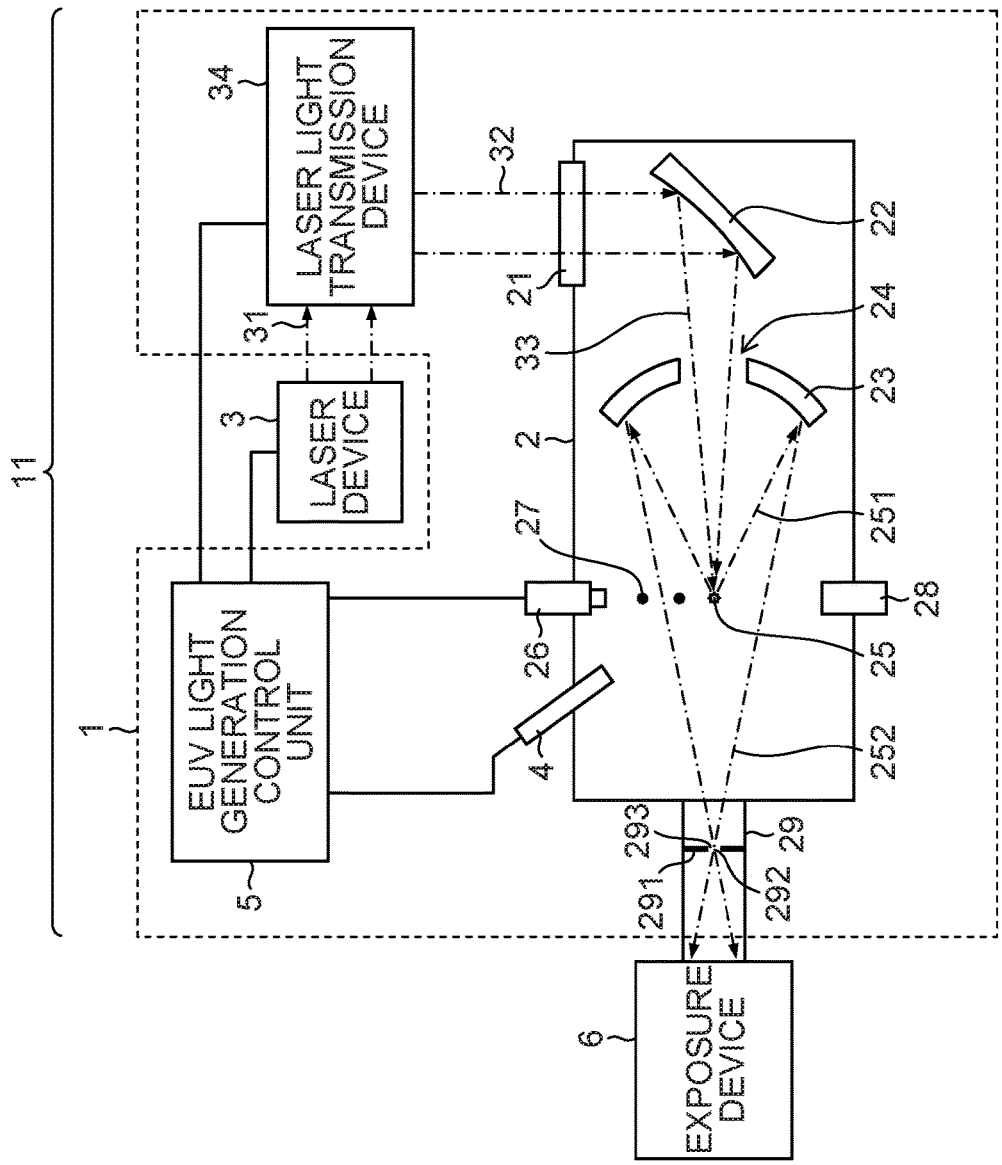
FIG. 1 is a diagram schematically illustrating a configuration of an exemplary LPP type EUV light generation system.

FIG. 1 schematically illustrates a configuration of an exemplary LPP type EUV light generation system. An EUV light generation device 1 may be used together with at least one laser device 3. In the present disclosure, a system including the EUV light generation device 1 and a laser device 3 is referred to as an EUV light generation system 11. As illustrated in FIG. 1 and described below in detail, the EUV light generation device 1 includes a chamber 2 and a target feeding unit 26. The chamber 2 is a sealable container.

The target feeding unit 26 feeds a target substance to the inside of the chamber 2, and is mounted so as to penetrate a wall of the chamber 2, for example. The material of the target substance output from the target feeding unit 26 may include, but not limited to, tin, terbium, gadolinium, lithium, xenon, or a combination of any two or more of them.

A wall of the chamber 2 has at least one through hole. The through hole is closed with a window 21 through which pulse laser light 32 output from the laser device 3 is transmitted. An EUV light condensing mirror 23 having a spheroidal reflection surface is disposed in the chamber 2, for example. The EUV light condensing mirror 23 has a first focus and a second focus. A multilayer reflection film in which molybdenum and silicon are alternately layered is formed on the surface of the EUV light condensing mirror 23, for example. The EUV light condensing mirror 23 may be disposed such that the first focus thereof is positioned in a plasma generation region 25 and the second focus thereof is positioned at an intermediate focusing point (IF) 292, for example. A center portion of the EUV light condensing mirror 23 has a through hole 24 through which pulse laser light 33 passes.

The EUV light generation device 1 includes a target sensor 4 and an EUV light generation control unit 5. The target sensor 4 detects any of or a plurality of presence, trajectory, position, and velocity of a droplet 27 as a target. The target sensor 4 may have an imaging function.

The EUV light generation device 1 also includes a connecting section 29 that allows the inside of the chamber 2 and the inside of an exposure device 6 to communicate with each other. A wall 291 having an aperture 293 is provided in the connecting section 29. The wall 291 may be disposed such that the aperture 293 is positioned at the second focus position of the EUV light condensing mirror 23.

Further, the EUV light generation device 1 also includes a laser light transmission device 34, a laser light condensing mirror 22, a target recovery unit 28 for recovering the droplet 27, and the like. The laser light transmission device 34 includes an optical element for defining a transmission state of the laser light, and an actuator for regulating the position, posture, and the like of the optical element.

1.2 Operation

Operation of the exemplary LPP type EUV light generation system will be described with reference to FIG. 1. The pulse laser light 31 having been output from the laser device 3 passes through the window 21 as pulse laser light 32 via the laser light transmission device 34, and enters the chamber 2. The pulse laser light 32 travels inside the chamber 2 along at least one laser light path, reflected by the laser light condensing mirror 22, and is radiated to at least one droplet 27 as pulse laser light 33.

The target feeding unit 26 may output the droplet 27 made of the target substance toward a plasma generation region 25 in the chamber 2. The droplet 27 is irradiated with at least one pulse included in the pulse laser light 33. The droplet 27 irradiated with the pulse laser light is made into plasma, and radiation light 251 is emitted from the plasma. EUV light 252 included in the radiation light 251 is selectively reflected by the EUV light condensing mirror 23. The EUV light 252 reflected by the EUV light condensing mirror 23 is condensed at the intermediate focusing point 292 and is output to the exposure device 6. One droplet 27 may be irradiated with a plurality of pulses included in the pulse laser light 33.

The EUV light generation control unit 5 presides over the control of the entire EUV light generation system 11. The EUV light generation control unit 5 processes a detection result of the target sensor 4. The EUV light generation control unit 5 may control the output timing of the droplet 27, the output direction of the droplet 27, and the like based on the detection result of the target sensor 4. Furthermore, the EUV light generation control unit 5 may control the oscillation timing of the laser device 3, the travel direction of the pulse laser light 32, and the condensing position of the pulse laser light 33, and the like, for example. The aforementioned various types of control are mere examples. Other types of control may be added as required.

2. Terms

"Target" is an object to be irradiated with laser light introduced into the chamber. The target irradiated with laser light is made into plasma and emits EUV light.

"Droplet" is a form of a target fed into the chamber. A droplet made of a liquid target substance may be a generation source of plasma.

"Plasma light" is radiation light radiated from plasma. The radiation light radiated from the target made into plasma is a form of plasma light. The radiation light includes EUV light.

The expression "EUV light" is an abbreviation of "extreme ultraviolet light".

"Piezo element" is synonymous with "piezoelectric element". The piezo element is a form of a vibration element.

Figure 2:
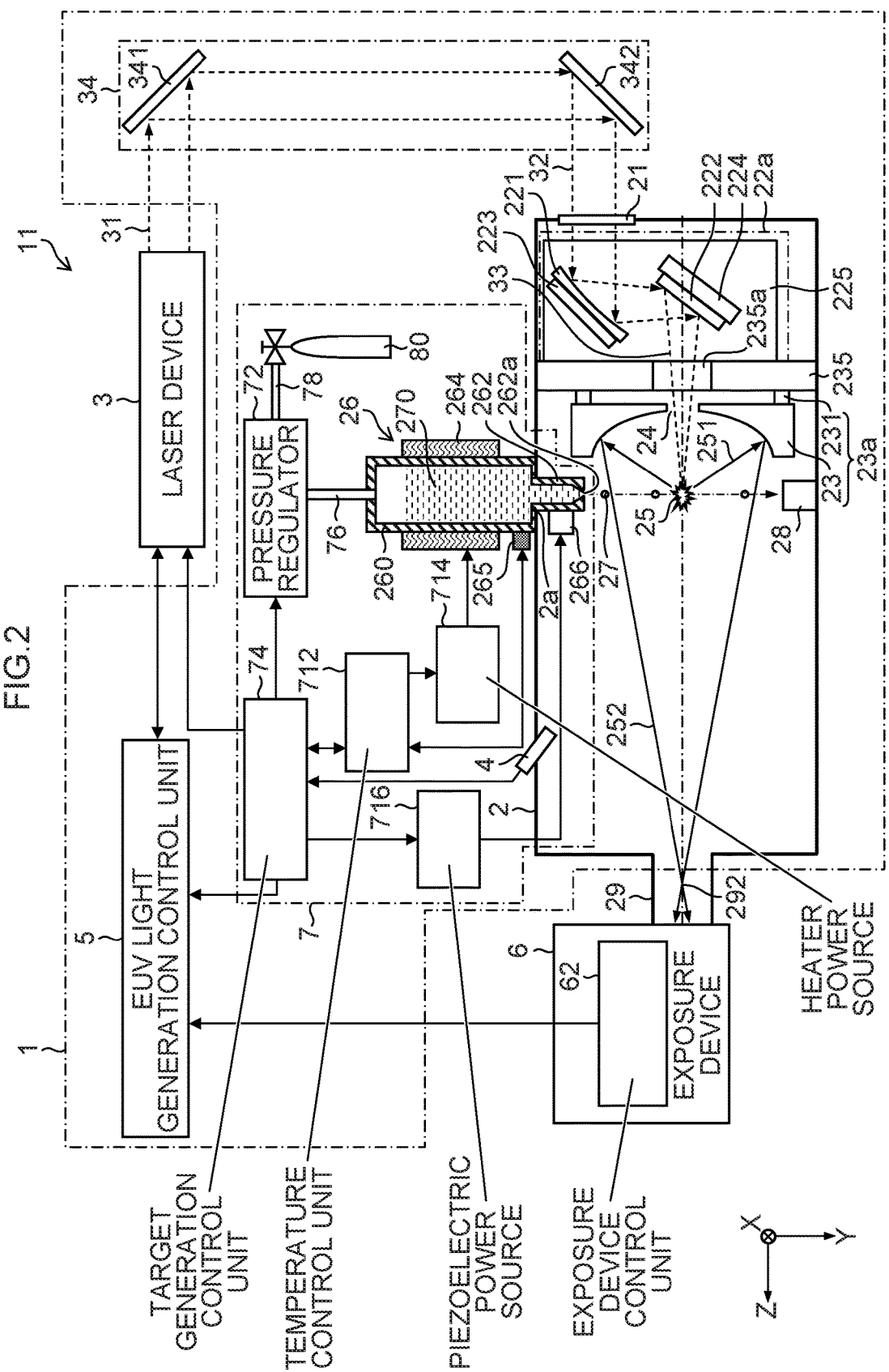
FIG. 2 is a diagram schematically illustrating a configuration of an EUV light generation device including a target generation device.
Figure 3:
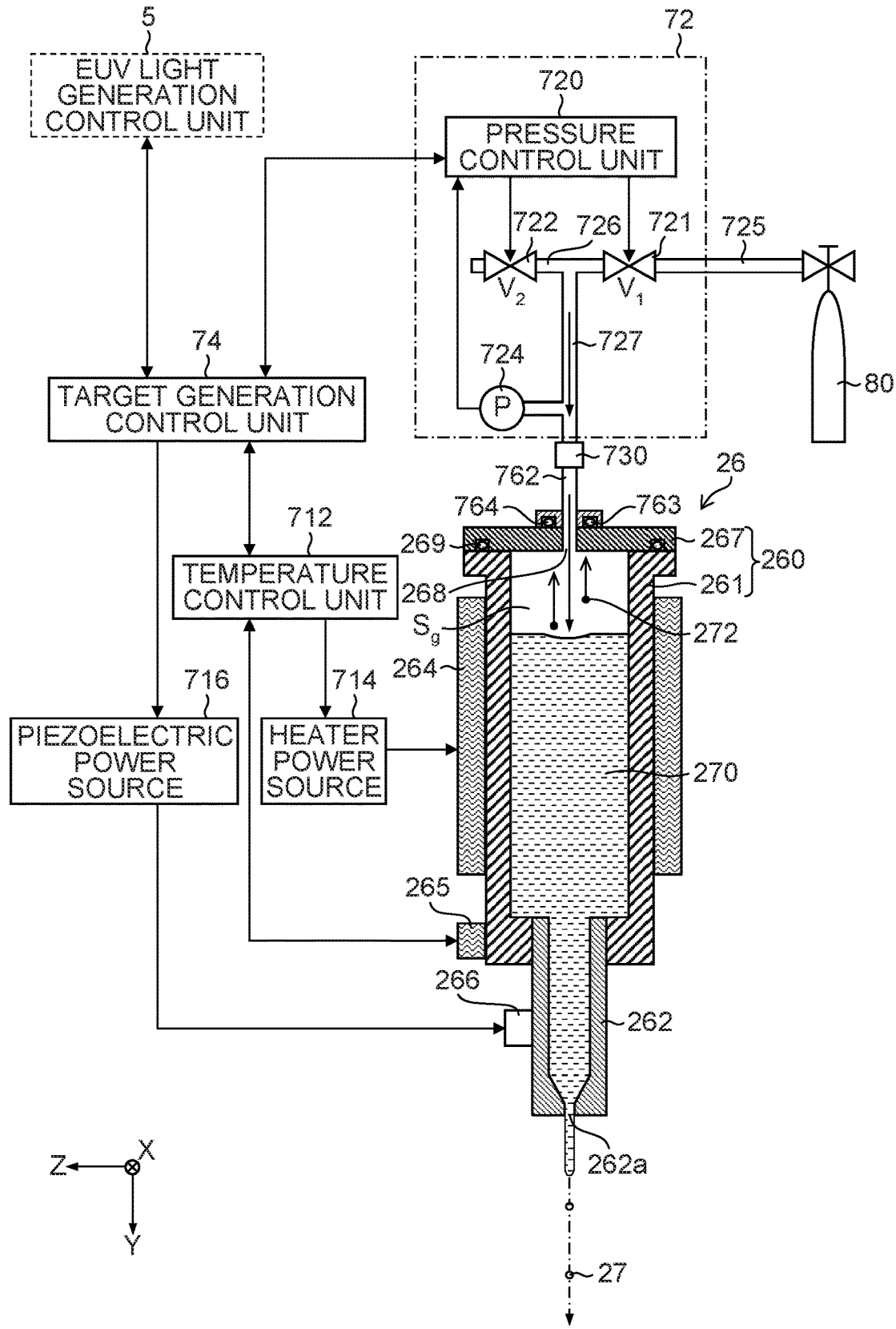
FIG. 3 is a diagram schematically illustrating a configuration of a target generation device.

3. Description of EUV Light Generation Device Including Target Generation Device 3.1 Configuration FIG. 2 is a diagram schematically illustrating a configuration of an EUV light generation device including a target generation device. FIG. 3 is a diagram schematically illustrating a configuration of a target generation device. In FIG. 2, XYZ orthogonal coordinate axes are introduced for convenience of explanation about direction. A direction of deriving EUV light from the chamber 2 toward the exposure device 6 is assumed to be a Z-axis direction. An X axis and a Y axis are orthogonal to the Z axis, and are orthogonal to each other. The center axis direction of the nozzle 262 for outputting the target substance is assumed to be a Y-axis direction. A direction perpendicular to the sheet of FIG. 2 is assumed to be an X-axis direction. The subsequent drawings after FIG. 3 also use the same coordinate axes as those introduced in FIG. 2.

The chamber 2 is formed in a hollow spherical shape or a hollow cylindrical shape, for example. The center axis direction of the cylindrical chamber 2 may be the Z-axis direction. A side face of the cylindrical chamber 2 may have a target feeding hole 2a for feeding the droplet 27 from the outside of the chamber 2 into the chamber 2. When the chamber 2 is a hollow spherical shape, the target feeding hole 2a is provided at a position that is on the wall of the chamber 2 and that a window 21 and a connecting section 29 are not disposed.

The chamber 2 is provided with a discharge device and a pressure sensor that are not illustrated. Further, the chamber 2 is connected with a gas supply device not illustrated.

A laser light condensing optical system 22a, and an EUV light condensing optical system 23a a target recovery unit 28, a first plate 235, and a second plate 225 are disposed inside the chamber 2.

The first plate 235 is fixed to the inner surface of the chamber 2. A hole 235a is provided in the center of the first plate 235, and pulse laser light 33 can pass through the hole 235a in the thickness direction of the first plate 235. The Opening direction of the hole 235a may be the same direction as an axis passing through a through hole 24 (see FIG. 1) and the plasma generation region 25.

The EUV light condensing optical system 23a is provided on one surface of the first plate 235. A second plate 225 is provided on the other surface of the first plate 235 via a triaxial stage not illustrated.

The laser light condensing optical system 22a is provided on the second plate 225. The laser light condensing optical system 22a includes an off-axis paraboloid mirror 221, a planar mirror 222, a first holder 223, and a second holder 224. The laser light condensing mirror 22 is configured of a combination of the off-axis paraboloid mirror 221 and the planar mirror 222.

The first holder 223 is a mirror holder for holding the off-axis paraboloid mirror 221. The first holder 223 is fixed to the second plate 225. The second holder 224 is a mirror holder for holding the planar mirror 222. The second holder 224 is fixed to the second plate 225.

The off-axis paraboloid mirror 221 is disposed to face the windows 21 and the planar mirror 222, respectively. The planar mirror 222 is disposed to face the hole 235a of the first plate 235 and the off-axis paraboloid mirror 221, respectively.

The second plate 225 is capable of changing the position and posture thereof by the triaxial stage. The position and the posture of the off-axis paraboloid mirror 221 and the planar mirror 222 may be adjusted along with a change in the position and the posture of the second plate 225. Adjustment of the positions and the posture of the off-axis paraboloid mirror 221 and the planar mirror 222 is performed such that pulse laser light 33 that is a reflected light of the pulse laser light 32 made incident on the off-axis paraboloid mirror 221 and the planar mirror 222 is condensed in the plasma generation region 25.

The EUV light condensing optical system 23a includes the EUV light condensing mirror 23 and the EUV light condensing mirror holder 231. The EUV light condensing mirror holder 231 holds the EUV light condensing mirror 23. The EUV light condensing mirror holder 231 is fixed to the first plate 235.

The target recovery unit 28 is disposed on an extended line in a travel direction of the droplet 27 output into the chamber 2. In FIG. 2, the output direction of the droplet 27 is a direction parallel to the Y axis, and the target recovery unit 28 is disposed at a position opposite to the target feeding unit 26 with respect to the Y axis direction.

The EUV light generation device 1 includes a laser light transmission device 34, the EUV light generation control unit 5, and the target generation device 7, outside the chamber 2.

The laser light transmission device 34 is provided between the window 21 provided in the chamber 2 and the laser device 3. FIG. 2 illustrates a configuration including a first high-reflective mirror 341 and a second high-reflective mirror 342 as an example of the laser light transmission device 34. Each of the first high-reflective mirror 341 and the second high-reflective mirror 342 is held by a mirror holder not illustrated.

The first high-reflective mirror 341 is disposed to face each of an emission port of the laser device 3 from which the pulse laser light 31 is emitted and the second high-reflective mirror 342. The second high-reflective mirror 342 is disposed to face each of the windows 21 of the chamber 2 and the first high-reflective mirror 341.

The position and the posture of each of the mirror holders that holds each of the first high-reflective mirror 341 and the second high-reflective mirror 342 are adjustable by an actuator not illustrated. This adjustment is performed such that the pulse laser light 32 that is a reflected light of the pulse laser light 31 made incident on the first high-reflective mirror 341 and the second high-reflective mirror 342 passes through the window 21 of the chamber 2.

The EUV light generation control unit 5 performs transmission and reception of control signals to and from the laser device 3 to control the operation of the laser device 3. The EUV light generation control unit 5 performs transmission and reception of respective control signals to and from the respective actuators of the laser light transmission device 34 and the laser light condensing optical system 22a. Thereby, the EUV light generation control unit 5 may adjust the traveling direction and the light condensing position of the pulse laser light 31, 32, and 33. The EUV light generation control unit 5 performs transmission and reception of control signals with the target generation control unit 74 of the target generation device 7 to control the operation of the target generation device 7.

The target generation device 7 includes the target feeding unit 26, a pressure regulator 72, and the target generation control unit 74. The target feeding unit 26 includes a tank 260, a nozzle 262, a heater 264, a temperature sensor 265, and a piezo element 266. The target generation device 7 includes a temperature control unit 712, a heater power source 714, and a piezoelectric power source 716.

The target feeding unit 26 forms a droplet in a continuous jet method, for example. In the continuous jet method, a standing wave may be given to a flow of jetted target substance generated by the oscillation of the nozzle 262 to thereby cyclically separate the target substance. The separated target substance may form a free interface by the own surface tension to thereby form the droplet 27.

The tank 260 is formed to have a hollow cylindrical shape. The hollow tank 260 contains the target substance therein. The target substance contained in the tank 260 is denoted by a reference numeral 270. At least the inside of the tank 260 is made of a material that resists chemical reaction with the target substance. The target substance may be tin (Sn), and materials that resist chemical reaction with tin (Sn) may include SiC, $SiO_2$, $Al_2O_3$, molybdenum, tungsten, tantalum, or the like.

A heater 264 and a temperature sensor 265 are disposed at the tank 260. The heater 264 is fixed to an outer side face of the cylindrical tank 260. The heater 264 is connected with the heater power source 714.

The heater power source 714 may supply electric power to the heater 264. The heater power source 714 is connected with a temperature control unit 712. When the heater 264 heats the tank 260, the target substance in the tank 260 may be heated and melted.

The temperature sensor 265 is fixed to the outer side face of the tank 260. It is preferable that the temperature sensor 265 is fixed to the vicinity of the nozzle 262 of the tank 260. The temperature sensor 265 is connected with the temperature control unit 712. The temperature sensor 265 may detect the temperature of the tank 260 and output a detection signal to the temperature control unit 712.

The temperature control unit 712 is connected with the target generation control unit 74. The temperature control unit 712 may be included in the target generation control unit 74. The temperature control unit 712 controls power supply to the heater 264 from the heater power source 714.

The temperature control unit 712 may regulate the electric power supplied to the heater 264 based on the detection signal output from the temperature sensor 265. A temperature regulation mechanism including the heater 264 and the heater power source 714 regulates the temperature of the tank 260 based on the control signal of the temperature control unit 712.

The nozzle 262 is provided at an end portion on the downstream side of the cylindrical tank 260. The plus direction of the Y axis is a direction toward the downstream side of the tank 260. One end of the nozzle 262 in a pipe shape is fixed to the hollow tank 260. The other end of the nozzle 262 in a pipe shape has a nozzle hole 262a.

The nozzle 262 is provided inside the chamber 2 through the target feeding hole 2a of the chamber 2. The target feeding hole 2a is closed when the target feeding unit 26 is disposed. The target feeding unit 26 is disposed so as to close the target feeding hole 2a of the chamber 2. Thereby, the inside of the chamber 2 may be isolated from the atmosphere.

The tank 260 provided at one end side of the nozzle 262 is positioned outside of the chamber 2, and the nozzle hole 262a provided at the other end side of the nozzle 262 is positioned inside of the chamber 2. A plasma generation region 25 provided in the chamber 2 is positioned on an extended line in the center axis direction of the nozzle 262. The insides of the tank 260, the nozzle 262, and the chamber 2 communicate with each other. The target feeding unit 26 may be provided in the chamber 2 in a posture in which the axial direction of the tank 260 is inclined in an oblique direction to be non-parallel to the gravity direction.

The nozzle hole 262a is formed in a shape such that a molten target substance is jetted into the chamber 2. Liquid tin may be adopted as an example of a target substance to be output from the nozzle hole. It is preferable that at least the inside of the nozzle 262 is made of a material that resists chemical reaction with the target substance.

The piezo element 266 is fixed to the outer side face of the pipe-shaped nozzle 262. The piezo element 266 fixed to the nozzle 262 provides oscillation necessary for forming droplets, to the nozzle 262. The piezo element 266 is connected with the piezoelectric power source 716. The piezoelectric power source 716 supplies electric power to the piezo element 266. The piezoelectric power source 716 is connected with the target generation control unit 74, and the power supply to the piezo element 266 is controlled by the target generation control unit 74.

The pressure regulator 72 is connected with the tank 260 via a pipe 76. The pressure regulator 72 is connected with the inert gas supply unit 80 via a pipe 78. The pressure regulator 72 may adjust the pressure of the gas introduced into the tank 260 to thereby regulate the pressure in the tank 260.

A part or all of the pipes 76 and 78 may be covered with a heat insulating material or the like not illustrated. Further, at least one of the pipes 76 and 78 may be provided with a heater not illustrated. The temperature in the pipe 76 may be kept at the same temperature as that in the tank 260 of the target feeding unit 26.

The inert gas supply unit 80 may include a gas cylinder filled with inert gas such as helium, argon, or the like. The inert gas supply unit 80 may supply inert gas into the tank 260 via the pressure regulator 72. The inert gas supply unit 80 of this example supplies argon gas, for example. The pressure regulator 72 is connected with the target generation control unit 74.

As illustrated in FIG. 3, the tank 260 includes a tank body 261 and a lid 267. The tank body 261 of the present example is generally cylindrical. The lid 267 closes the opening of the upstream end of the tank body 261. The minus direction of the Y axis is a direction toward the upstream side of the tank 260. The lid 267 has a gas inlet port 268 for introducing gas for pressurization into the tank 260. The gas inlet port 268 is an opening on the tank inner side of a gas passage formed by a hole penetrating through the lid 267. The gas passage formed by the hole penetrating through the lid 267 may be parallel or non-parallel to the axis of the tank 260. The gas inlet port 268 may be provided in a center portion of the lid 267.

The lid 267 is provided with a pipe 762 leading to the gas inlet port 268. One end of the pipe 762 has a flange portion 763. The flange portion 763 is fixed to the outer surface of the lid 267 with bolts not illustrated. The connecting section between the flange portion 763 and the lid 267 is provided with an O-ring 764. The connecting section between the flange portion 763 and the lid 267 is sealed with the O-ring 764.

The lid 267 is fixed to the tank body 261 with bolts not illustrated. A joint surface between the lid 267 and the tank body 261 is provided with an O-ring 269. The connecting section between the tank body 261 and the lid 267 is sealed with the O-ring 269.

As illustrated in FIG. 3, the pressure regulator 72 includes a pressure control unit 720, a first valve 721, a second valve 722, a pressure sensor 724, a first pipe 725, a second pipe 726, and a third pipe 727. In FIG. 3, the first valve 721 is expressed as "$V_1$", and the second valve 722 is expressed as "$V_2$". The first pipe 725 is equivalent to the pipe 78 illustrated in FIG. 2.

One end of the first pipe 725 is connected with the inert gas supply unit 80, and the other end of the first pipe 725 is connected with the second pipe 726 and the third pipe 727. The connecting section at which the first pipe 725, the second pipe 726, and the third pipe 727 are connected with each other is referred to as a pipe branch point. The first valve 721 is provided in the first pipe 725 between the pipe branch point and the inert gas supply unit 80.

One end of the second pipe 726 is connected with the first pipe 725 and the third pipe 727, and the other end of the second pipe 726 is opened. "Open" means to be communicated with the atmosphere. The other end of the second pipe 726 may be connected with a discharge pump not illustrated. The second valve 722 is provided in the second pipe 726.

One end of the third pipe 727 is connected with the first pipe 725 and the second pipe 726, and the other end of the third pipe 727 is connected with the pipe 762 via a joint 730. The pressure sensor 724 is disposed to the third pipe 727 between the pipe branch point and the joint 730. The pipes including the third pipe 727 and the pipe 762 connected via the joint 730 corresponds to the pipe 76 illustrated in FIG. 2.

The first valve 721 and second valve 722 may regulate the flow of gas in the first pipe 725, the second pipe 726, and the third pipe 727 by the opening and closing operation of the respective valves. Each of the first valve 721 and the second valve 722 may be a solenoid valve. The first valve 721 and second valve 722 are respectively connected with the pressure control unit 720.

The pressure sensor 724 may detect the pressure in the gas containing space $S_g$ in the tank 260 which communicates with the pressure sensor 724 through the third pipe 727 and the pipe 762. The gas containing space $S_g$ in the tank 260 is a space where the target substance is not contained, of the entire space in the tank 260. The pressure sensor 724 is connected with the pressure control unit 720. The pressure sensor 724 may output a detection signal of the detected pressure to the pressure control unit 720.

The pressure control unit 720 is connected with the target generation control unit 74. The pressure control unit 720 outputs a valve open signal or a valve close signal to each of the first valve 721 and second valve 722 in accordance with an instruction from the target generation control unit 74 to control opening and closing operation of each valve. The pressure control unit 720 may provide information of the pressure obtained from the pressure sensor 724 to the target generation control unit 74.

The pressure control unit 720 may output an operation signal or an operation stop signal to a discharge pump (not illustrated) for discharging the gas in the tank 260 in accordance with an instruction from the target generation control unit 74 to control the discharge operation of the discharge pump.

The pressure regulator 72 may increase or decrease the pressure in the tank 260 by supplying or discharging the gas to or from the tank 260.

The target generation control unit 74 is connected with each of the EUV light generation control unit 5, the laser device 3, the target feeding unit 26, and the target sensor 4. The target generation control unit 74 controls operation of the target feeding unit 26 in accordance with an instruction from the EUV light generation control unit 5.

The EUV light generation control unit 5 presides over the control of the entire EUV light generation system 11. The EUV light generation control unit 5 may perform transmission and reception of signals with the exposure device control unit 62 that is a control unit of the exposure device 6. Thereby, the EUV light generation control unit 5 may collectively control operation of the entire EUV light generation system 11 based on an instruction from the exposure device 6. The EUV light generation control unit 5 controls the output timing of the droplet 27, the output direction of the droplet 27, and the like, for example, based on the detection result of the target sensor 4. Furthermore, the EUV light generation control unit 5 controls the oscillation timing of the laser device 3, the travel direction of the pulse laser light 32, the condensing position of the pulse laser light 33, and the like, for example. The aforementioned various types of control are mere examples. Other types of control may be added as required, or part of the control functions may be omitted.

In the present disclosure, controllers such as the EUV light generation control unit 5, the target generation control unit 74, and the exposure device control unit 62 can be realized by a combination of hardware and software of one or a plurality of computers. Software has the same meaning as a program. A programmable controller is included in the concept of computer.

It is also possible to realize functions of a plurality of controllers by one controller. Further, in the present disclosure, the EUV light generation control unit 5, the target generation control unit 74, the exposure device control unit 62, and the like may be connected with each other over a communication network such as a local region network or the Internet. In a distributed computing environment, a program unit may be stored in memory storage devices of both local and remote.

3.2 Operation

With reference to FIG. 2, operation of the EUV light generation device 1 will be described. The EUV light generation control unit 5 controls discharge by a discharge device (not illustrated) and gas supply from a gas supply device such that the pressure in the chamber 2 falls within a given range, based on a detection value of a pressure sensor (not illustrated) provided in the chamber 2. The given range of the pressure in the chamber 2 is a value between several pascals [Pa] to several hundreds pascals [Pa], for example.

The target generation control unit 74 controls the heater 264 via the temperature control unit 712 when a target generation signal is input from the EUV light generation control unit 5 such that the temperature of the target substance in the tank 260 reaches a predetermined temperature equal to or higher than the melting point.

The temperature control unit 712 controls the heater power source 714 based on a value detected by the temperature sensor 265 in accordance with the control of the target generation control unit 74. When the target substance is tin (Sn), the temperature control unit 712 controls the heater 264 to thereby heat the tin in the tank 260 to have a temperature equal to or higher than the melting point (for example, a predetermined temperature ranging from 250° C. to 290° C.). The melting point of tin is 232° C. As a result, the tin contained in the tank 260 may melt. Liquid tin that is melted to be in a liquid state may correspond to a form of a "liquid target substance". Liquid tin is synonymous with "molten tin".

The target generation control unit 74 transmits an electrical signal of a predetermined frequency and a predetermined duty to the piezo element 266 via the piezoelectric power source 716 such that the liquid tin that is output from the nozzle 262 generates the droplet 27. The piezoelectric power source 716 supplies electric power for driving to the piezo element 266 in accordance with an instruction from the target generation control unit 74. As a result, the piezo element 266 oscillates, and regular disturbance is given to the jets of liquid tin output from the nozzle hole 262a by the oscillation of the nozzle hole 262a. Thereby, the liquid tin in the form of jet is divided into the droplets 27, and the droplets 27 having almost the same volume can be generated cyclically.

The target generation control unit 74 controls the pressure regulator 72 to realize a pressure that the droplet 27 reaches the plasma generation region 25 at a predetermined velocity. This means that the target generation control unit 74 controls the pressure regulator 72 such that the pressure in the tank 260 becomes a pressure that can output a jet of liquid tin from the nozzle hole 262a at a predetermined velocity.

The target generation control unit 74 transmits, to the pressure control unit 720 of the pressure regulator 72, a target pressure value $P_t$ at which the droplet 27 reaches the plasma generation region 25 at a predetermined velocity. The pressure control unit 720 controls opening and closing of the first valve 721 or the second valve 722 such that the value of a difference $\Delta P$ between the pressure P measured by the pressure sensor 724 and the target pressure value $P_t$ is decreased. As a result, the pressure supplied to the tank 260 of the target feeding unit 26 is stabilized at the target pressure value $P_t$.

The initial pressure before regulating the pressure by the pressure regulator 72 is 0.1 megapascals [MPa], for example, and the target pressure value $P_t$ is 20 megapascals [MPa], for example. Therefore, the pressure of the inert gas in the tank 260 increases sharply from 0.1 megapascals [MPa] to 20 megapascals [MPa] by the pressure regulating operation based on an instruction from the target generation control unit 74.

When the gas pressure of the target pressure value $P_t$ is applied to the tank 260 of the target feeding unit 26, the target substance in the form of jet is output from the nozzle holes 262a, and the droplet 27 is generated in accordance with oscillation of the nozzle 262 by the piezo element 266 driven.

Thus, the target substance is output from the nozzle hole 262a, and the droplet 27 is fed to the plasma generation region 25.

When the droplet 27 passes through a predetermined position on the trajectory between the nozzle hole 262a and the plasma generation region 25, the target sensor 4 may detect the droplet 27 and generate a passage timing signal. The passage timing signal is input to a delay circuit not illustrated. The delay circuit adds a delay time to the passage timing signal to generate a light emission trigger signal. The light emission trigger signal is transmitted to the laser device 3. The delay time of the delay circuit may be set such that the light emission trigger signal is input to the laser device 3 before the droplet 27 passes through the predetermined position and reaches the plasma generation region 25. This means that the delay time may be set such that the pulse laser light output from the laser device 3 is radiated to the droplet 27 when the droplet 27 reaches the plasma generation region 25. The delay circuit may be included in the EUV light generation control unit 5.

The pulse laser light 31 having been output from the laser device 3 is guided to the plasma generation region 25 via the first high-reflective mirror 341, the second high-reflective mirror 342, and the laser light condensing optical system 22a, and is radiated to the droplets 27. Thus, the droplet 27 is made into plasma by radiating the pulse laser light 33 in synchronism with the droplet 27 reaching the plasma generation region 25, and the EUV light is generated.

4. Problem

Hereinafter, while description will be given on the case where the target substance is tin, the same applies to the target substance other than tin.

When the inert gas is supplied into the tank 260 at a higher pressure through the pipe 76 in order to start output of liquid tin from the nozzle 262, the inert gas impinges on the liquid tin in the tank 260 and the tin jumps from the liquid surface. The jumped tin 272 may enter the pipe 762 from the gas inlet port 268. As a result, the solidified tin may be fixed whereby supply of inert gas may be suppressed inside at least one gas passage of the pipe 762 and the joint 730.

Further, the pipe 762 and the joint 730 for supplying inert gas to the tank 260 are often made of a material such as stainless steel (SUS), for example. At least one of the pipe 762 and the joint 730 that are made of a material such as SUS reacts with the tin, whereby an impurity may be generated. The impurity generated by the reaction with the tin may be back to the tank 260, and the impurity may enter the nozzle 262, whereby the nozzle 262 may be clogged.

5. First Embodiment

5.1 Configuration

Figure 4:
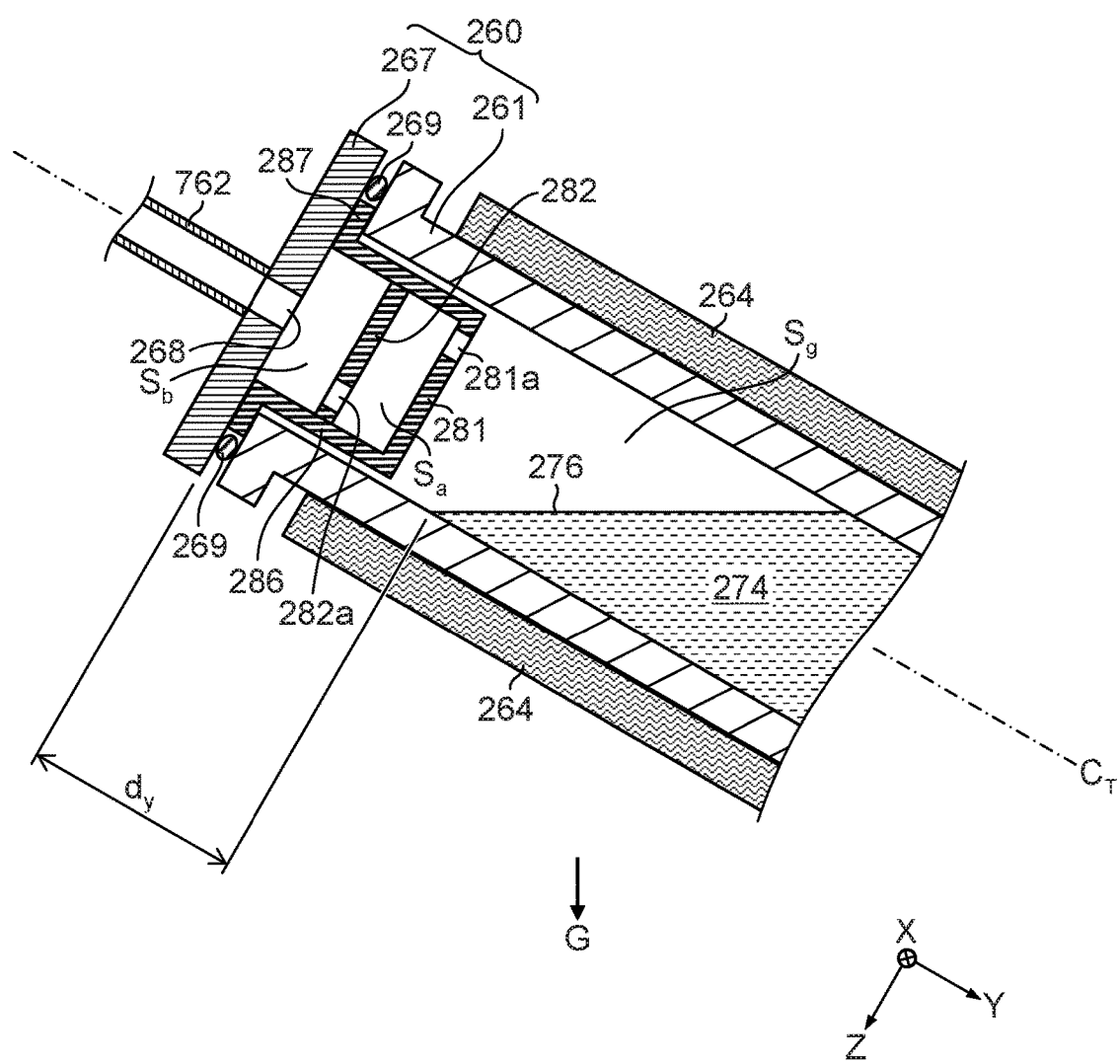
FIG. 4 is a cross-sectional view schematically illustrating a configuration of a part of a target generation device according to a first embodiment.

FIG. 4 is a cross-sectional view schematically illustrating a configuration of a part of a target generation device according to a first embodiment. FIG. 4 illustrates an upstream portion of the tank 260. The tank 260 is provided on the chamber 2 in a posture in which the center axis $C_T$ along the longitudinal direction of the tank body 261 is inclined obliquely with respect to the gravity direction.

In FIG. 4, the chamber 2 and the nozzle 262 are omitted although they are illustrated in FIG. 2. Further, in FIG. 4, the flange portion 763 is omitted although it is illustrated in FIG. 3. The downward direction in FIG. 4 is a gravity direction. In FIG. 4, the gravity direction is indicated by an arrow G. A direction from the lid 267 side to the nozzle 262 along the center axis $C_T$ of the tank 260 is a plus direction of the Y axis. The plus direction of the Y axis is referred to as a "plus Y direction". The minus direction of the Y axis which is a direction opposite to the plus Y direction is referred to as a "minus Y direction".

The center axis $C_T$ corresponds to the axis of the tank 260. The direction of the center axis $C_T$ is referred to as the axial direction of the tank 260. While the direction of the X axis orthogonal to the Y axis may take various directions, a direction perpendicular to the sheet of FIG. 4 is assumed to be the X axis in this example, in order to simplify the description. FIG. 4 illustrates a cross-section of the tank 260 cut along a vertical plane including the center axis $C_T$ and parallel to the YZ plane.

The tilt angle of the tank 260 may be designed to be an appropriate angle by which the center axis $C_T$ is non-parallel and non-perpendicular to the gravity direction. For example, it is designed that an angle defined by the center axis $C_T$ of the tank 260 and the horizontal plane is an angle ranging from twenty degrees to eighty degrees. As a specific example, it may be designed that an angle defined by the center axis $C_T$ and the horizontal plane of the tank 260 is thirty degrees.

The tank 260 contains the liquid tin 274 that is a molten target substance. The liquid tin 274 is an example of a target material denoted by a reference numeral 270 in FIG. 3. The liquid surface 276 of the liquid tin 274 in the tank 260 can be a horizontal surface perpendicular to the gravity direction. The upstream end of the tank body 261 is closed with a lid 267. The lid 267 has the gas inlet port 268. The lid 267 is connected with the pipe 762 leading to the gas inlet port 268. The lid 267 is an example of a lid part.

In order to prevent the target substance jumped from the liquid surface 276 from entering the gas inlet port 268, the target generation device 7 has a plurality of shielding plates 281 and 282 at a position between the liquid surface 276 and the gas inlet port 268 inside the tank 260. The first embodiment shows an example in which two shielding plates 281 and 282 are provided in the vicinity of the gas inlet port 268 inside the tank 260. The shielding plates 281 and 282 have through holes 281a and 282a that allow the gas to pass through, respectively. The through holes 281a and 282a each are examples of non-shielding regions for gas passage.

The through holes 281a and 282a of the shielding plates 281 and 282 are arranged such that one of the through holes 281a and 282a is not seen into the other of the through holes 281a and 282a between the two shielding plates 281 and 282. The positional relation "one of the through holes 281a and 282a is not seen into the other of the through holes 281a and 282a" means a positional relation in which when the shielding plates 281 and 282 are seen from the front side of one shielding plate 281 to the back side of the other shielding plate 282, no portion of the through hole 281a overlaps with the through hole 282a, and it is impossible to see the back side of the other shielding plate 282 through the through hole 281a. In the present example, when the two shielding plates 281 and 282 are seen in a plan view from the Y axis direction, the through holes 281a and 282a are arranged at non-overlapping positions in which no portions of the through holes 281a and 282a overlap with each other.

In the present example, the through hole 282a of the shielding plate 282 that is disposed in the vicinity of the gas inlet port 268 out of the two shielding plates 281 and 282, and the gas inlet port 268 are arranged at non-overlapping positions in which no portions of the through hole 282a and the gas inlet port 268 overlap with each other when seen in a plan view from the Y axis direction.

The shielding plates 281 and 282 are disposed in the gas containing space $S_g$ of the internal space of the tank 260. The internal space of the tank 260 can be divided into a target substance storage space that is a spatial region in which the liquid tin 274 is stored, and the gas containing region $S_g$ that is a spatial region in which gas for pressurization is stored. The target substance is retained on the lower side of the tank 260, that is, the downstream side, by the gravity. Then, the gas containing space $S_g$ may be a space portion on the upstream side in contact with the lid 267, of the internal space of the tank 260.

The size of the gas containing space $S_g$ is determined by the amount of liquid tin 274 to be contained in the tank 260. While the size of the actual target substance containing space may vary depending on the amount of the liquid tin 274, the maximum containable quantity of the target material is defined for the tank 260. The maximum containable quantity is determined under consideration that the capacity of the gas containing space $S_g$ required for containing the inert gas for pressurization, of the internal space of the tank 260, should be secured. A target substance containing space which will be filled with the target substance when the target substance of the maximum containable quantity is contained in the tank 260 is referred to as the "target substance maximum quantity containable space". A liquid surface position of the liquid target substance filling the target substance maximum quantity containable space corresponds to a liquid surface upper limit position.

FIG. 4 illustrates a state where the liquid tin 274 of the maximum containable quantity is contained in the tank 260. The position of the liquid surface 276 illustrated in FIG. 4 may be understood as the liquid surface upper limit position. The fact that the maximum containable quantity of the tank 260 is defined and the fact that the liquid surface upper limit position in the tank 260 is defined have the same meaning.

This means that the liquid surface upper limit position defining the maximum liquid surface height position acceptable as a liquid surface height of the liquid target substance to be contained in the tank 260 is defined. At least a space on the upstream side than the liquid surface upper limit position of the internal space of the tank 260 can be a gas containing space $S_g$. The shielding plates 281 and 282 are disposed in the gas containing space $S_g$ that is a space on the upstream side than the liquid surface upper limit position, that is, at a position closer to the gas inlet port 268 than the liquid surface upper limit position.

When the shortest distance in the Y axis direction from the inner surface of the lid 267 where the gas inlet port 268 is formed to the liquid surface upper limit position is $d_y$ millimeters [mm], the shielding plates 281 and 282 are disposed at positions within $d_y$ millimeters [mm] from the inner surface of the lid 267. The inner surface of the lid 267 is a surface facing the inside of the tank 260. As an example, $d_y$=30 millimeters [mm], and as a specific design example, the shielding plates 281 and 282 are disposed at positions within 30 millimeters [mm] in the plus Y direction from the lid 267.

The respective shielding plates 281 and 282 of the present example are disposed so as to be perpendicular to the axis of the tank 260 at different positions in the Y-axis direction. However, the positions thereof are not limited to such a layout. The shielding plates 281 and 282 may be disposed in a non-perpendicular orientation with respect to the center axis $C_T$ of the tank 260. The shielding plates 281 and 282 may be non-parallel to each other. The spacing between the two shielding plates 281 and 282 can be designed to have an appropriate distance.

In addition, the target generation device 7 of the first embodiment includes a side wall member 286 in a cylindrical shape that surrounds the side faces of the shielding plates 281 and 282. The shielding plates 281 and 282 are supported by the side wall member 286. The side wall member 286 may be formed integrally with the shielding plate 281. The shielding plate 282 is disposed inside the side wall member 286. The side wall member 286 functions as a shielding cylinder surrounding a side face portion of the space between the lid 267 and the shielding plate 281. There may be a gap between the side wall members 286 and the inner wall surface of the tank 260.

It is preferable that the shielding plates 281 and 282 and the side wall member 286 are made of a material that resists chemical reaction with the target substance. SiC, $SiO_2$, $Al_2O_3$, molybdenum, tungsten, tantalum, or the like may be used as the material that resists chemical reaction with the target substance. It is preferable that the shielding plates 281 and 282 and the side wall member 286 are made of the same material as that of the tank 260.

The cylindrical side wall member 286 has a flange portion 287 at an end portion on the lid 267 side in the axial direction. The flange portion 287 is interposed between the tank body 261 and the lid 267, and the lid 267 is fixed to the tank body 261 by bolts not illustrated. Thereby, the side wall member 286 is fixed to the tank 260. The connecting section between the tank body 261 and the lid 267 is provided with an O-ring 269. The connecting section between the tank body 261 and the lid 267 is sealed with the O-ring 269.

Figure 5:
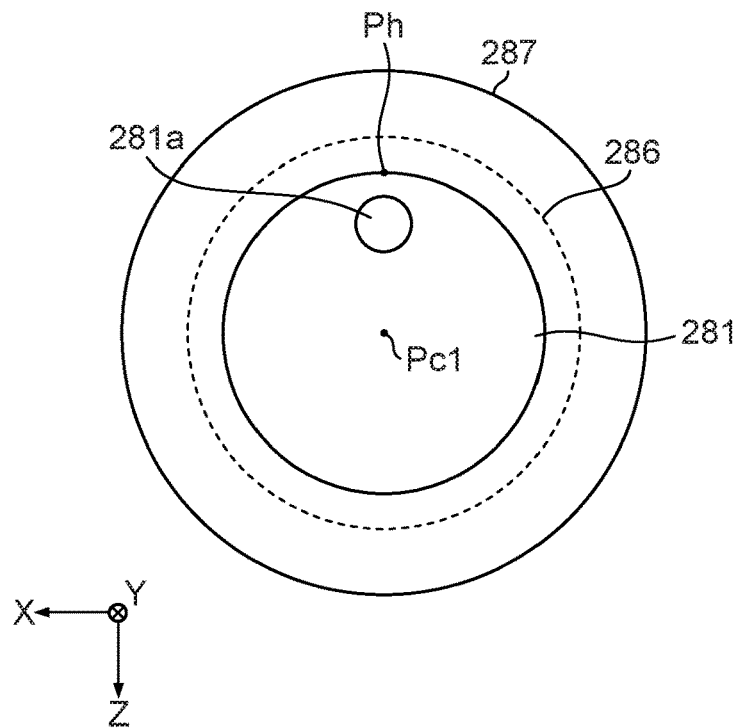
FIG. 5 is a plan view illustrating an example of a shielding plate supported by a side wall member.

FIG. 5 is a plan view illustrating the shielding plate 281 supported by the side wall member 286. FIG. 5 is a plan view of the shielding plate 281 seen from the lid 267 side toward the nozzle 262. In FIG. 5, the shielding plate 282 in the vicinity of the lid 267 is not illustrated. The shielding plate 281 has an almost circular shape in a plan view. The center point of the shielding plate 281 coincides with the position of the center axis of the tank 260.

Figure 6:
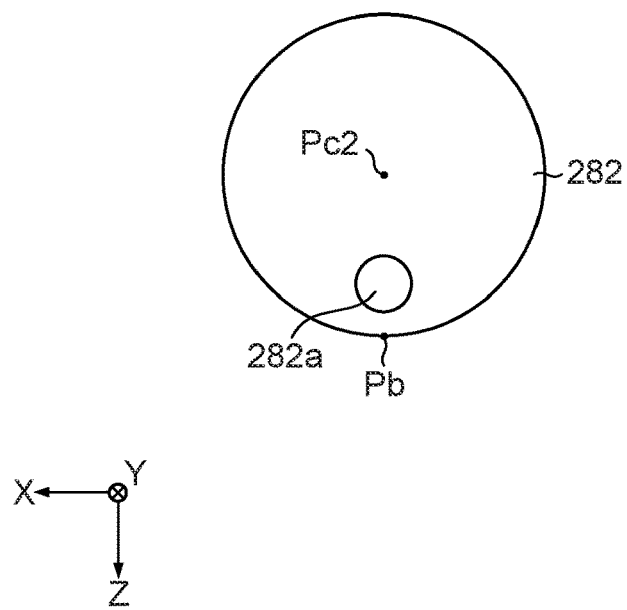
FIG. 6 is a plan view illustrating an example of another shielding plate used in the first embodiment.

FIG. 6 is a plan view of the shielding plate 282. FIG. 6 is a plan view of the shielding plate 282 seen from the lid 267 side toward the nozzle 262. In FIG. 6, the side wall member 286 is not illustrated.

5.2 Operation

Operation of the target generation device according to the first embodiment will be described with reference to FIGS. 4 to 6. The periphery of the gas inlet port 268 of the tank 260 is covered with a structure including the shielding plates 281 and 282 and the side wall member 286. The side wall member 286 is in close contact with the tank 260 via the flange portion 287. The heat of the tank 260 heated by the heater 264 is transmitted from the side wall member 286 to the shielding plates 281 and 282. Thereby, the temperature of the shielding plates 281 and 282 may be maintained at a temperature equal to or higher than the melting point of tin. It is preferable that the material of the shielding plates 281 and 282 and the side wall member 286 is a material having high heat conductivity.

As the material of the shielding plates 281 and 282 and the side wall member 286 and the material of the tank 260 are the same, an influence of stress due to a thermal expansion difference may be reduced. In the case of producing the shielding plates 281 and 282 and the side wall member 286 with use of a material different from the material of the tank 260, it is preferable to produce them by using a material having the same level of heat conductivity as that of the material of the tank 260.

The shielding plates 281 and 282 and the side wall members 286 constitute a target substance entry suppressing structure that suppresses entry of the target substance to the gas inlet port 268. The through hole 281a of the shielding plate 281 and the through hole 282a of the shielding plate 282 are arranged at positions not seen through mutually. A passage path of the gas entering from one through hole to the other through hole is a nonlinear communication path. The structure constituting the nonlinear communication path as described above is called a labyrinth structure.

In the first embodiment, the gas passage path from the through hole 282a to the through hole 281a through an inter-shielding plate space $S_a$ is a non-linear communication path. The gas inlet port 268 and the through hole 282a are also arranged at positions not overlapping each other when viewed from the Y axis direction. This means that the gas passage path from the gas inlet port 268 to the liquid surface 276 of the liquid tin 274 through the through hole 282a, the inter-shielding plate space $S_a$, and the through hole 281a is a nonlinear communication path. The nonlinear communication path functions as a labyrinth structure that prevents the tin jumped from the liquid surface 276 of the liquid tin 274 from entering the gas inlet port 268.

The gas having been introduced into the tank 260 from the gas inlet port 268 may pass through a most upstream communication space $S_b$ that is a space between the lid 267 and the shielding plate 282, and then the through hole 282a, to enter the inter-shielding plate space $S_a$. The gas may further pass through the through hole 281a to reach the liquid surface 276 of the liquid tin 274. In this way, the gas introduced into the tank 260 is contained in the gas containing space $S_g$. The liquid tin 274 is pressurized by the pressure of the gas filled in the gas containing space $S_g$.

The gas introduced into the tank 260 may impinge on the liquid tin 274 in the tank 260, and small droplets of tin may jump up from the liquid surface 276. The two shielding plates 281 and 282 serve as a tin splash entry suppression plate that suppresses entry of the tin jumped up from the liquid surface 276 to the gas inlet port 268.

The shielding plate 281 which is arranged on the most downstream side out of the shielding plates 281 and 282, is a shielding plate closest to the liquid surface 276 out of the shielding plates 281 and 282. The first shielding plate 281 suppresses entry of the tin, jumped up from the liquid surface 276, to the space upstream of the tank 260 than the shielding plate 281. However, there may be a case where the tin passes through the through hole 281a of the shielding plate 281.

The second shielding plate 282 that is arranged farther from the liquid surface 276 than the first shielding plate 281, suppresses entry of the tin having passed through the through hole 281a of the first shielding plate 281, to the gas inlet port 268.

The second shielding plate 282 disposed between the first shielding plate 281 and the gas inlet port 268 suppresses entry of the tin having passed through the through hole 281a of the first shielding plate 281, to the gas inlet port 268.

The side wall member 286 suppresses entry of the tin to the inter-shielding plate space $S_a$ and the most upstream communication space $S_b$ from the side face direction. The "side face direction" in this context means a direction of a side periphery that is a direction facing the cylindrical surface that is the inner wall of the tank 260 and a direction orthogonal to the axial direction of the tank 260. As side faces of the two shielding plates 281 and 282 are surrounded by the cylindrical side wall member 286, entry of the tin from the side face direction to the inter-shielding plate space $S_a$ and the most upstream communication space $S_b$ is suppressed by the side wall member 286.

It is preferable that the through holes 281a of the first shielding plate 281 disposed closest to the liquid surface 276 out of the shielding plates 281 and 282 is provided at a farthest possible position from the liquid surface 276. For example, the through hole 281a is provided at a high position on the upper side in the vertical line direction from the position of the center point of the shielding plate 281. The vertical line direction means a direction of a straight line parallel to the gravity direction. A line parallel to the gravity direction is referred to as a "vertical line".

In the first embodiment, the through holes 281a is arranged on a line linking a highest point position Ph that is a highest point position in the vertical line direction on the circumference forming the outer edge of the shielding plate 281, and a center point Pc1 of the shielding plate 281. The highest point position Ph of the shielding plate 281 is a position of a point on the circumference arranged immediately above the center point Pc1 of the shielding plate 281 in FIG. 5. The outer edge of the shielding plate 281 may be understood to be an outer circumferential circle defined by the outer diameter of the side wall member 286, or may be understood to be an inner circumferential circle defined by the inner diameter of the side wall member 286.

On the other hand, it is preferable that the through hole 282a of the second shielding plate 282 is provided at a farthest possible position from the through hole 281a of the first shielding plate 281. For example, the through hole 282a is provided at a position on the lower side in the vertical line direction from the center point Pc2 of the shielding plate 282, that is, at a position lower than the position of the center point Pc2 in the gravity direction. In the first embodiment, the through holes 282a is arranged on a line linking a lowest point position Pb that is a lowest position in the vertical line direction on the circumference forming the outer edge of the shielding plate 282, and a center point Pc2 of the shielding plate 282. The lowest point position Pb of the shielding plate 282 is a position of a point on the circumference arranged immediately below the center point Pc2 of the shielding plate 282 in FIG. 6.

The outer edge of the shielding plate 282 may be understood to be an outer circumferential circle defined by the outer diameter of the side wall member 286, or may be understood to be an inner circumferential circle defined by the inner diameter of the side wall member 286. As illustrated in FIGS. 5 and 6, the through hole 281a and the through hole 282a are positioned such that the through hole 281a and the through hole 282a are aligned in the vertical line direction running through the center of the tank 260 when seen in a plan view from the Y axis direction.

The shape and the size of the through holes 281a and 282a provided in the shielding plates 281 and 282 can be designed in various forms. The shape of the through holes 281a and 282a is not limited to a circle but can be designed in any closed curved shape such as an ellipse, a polygonal, or the like. The through holes 281a and 282a of the shielding plates 281 and 282 may be in the same shape. Alternatively, the through holes 281a and 282a may be different in the shape and/or size thereof between the shielding plates. The number of the through holes 281a and 282a provided in the respective shielding plates 281 and 282 can be designed in one or more appropriate number. In the case where two or more through holes are provided in one shielding plate, the respective through holes may be in the same shape or in different shape and/or size.

The first embodiment illustrated in FIGS. 4 to 6 describes an example in which a circular through hole of the same size is provided in each of the shielding plates 281 and 282, as a simplest example.

In order to have a configuration in which one of the through holes 281a and 282a is not seen into the other of the through holes 281a and 282a between the shielding plates 281 and 282 when each of the through holes 281a and 282a serving as a non-shielding region is a circle, it is preferable that the diameters of the through holes 281a and 282a are equal to or smaller than the radius of the inner diameter of the tank 260. It is also preferable that the diameters of the through holes 281a and 282a have values larger than the diameter of a small droplet of tin jumped up from the liquid surface 276 of the liquid tin 274 in the tank 260. It is considered that the diameter of a small droplet of the tin jumped up from the liquid surface 276 may be smaller than 1 millimeter [mm]. A specific preferable example of the through holes 281a and 282a is a circular through hole having a diameter of 1 millimeter [mm] or larger within a range not larger than the radius of the inner diameter of the tank 260. For example, the diameter of the through holes 281a and 282a is designed in a range from 1 millimeter [mm] to 10 millimeters [mm].

The shielding plate 281 in the first embodiment corresponds to a most downstream shielding plate. The shielding plate 282 in the first embodiment corresponds to a most upstream shielding plate.

5.3 Effect

According to the first embodiment, most tin deposition is found only between the shielding plate 281 and the shielding plate 282. Slight deposition is found at a position corresponding to the through hole 282a of the shielding plate 282 on the inner surface of the lid 267, very rarely.

Deposition of tin is not observed on the gas inlet port 268 and the pipe 762. Degradation of function of the seal portion due to corrosion of the seal portion of the joint 730 and clogging of the pipe 762 which may be caused by deposition of tin are not found.

The shielding plates 281 and 282 can be removed from the tank 260 together with the side wall member 286. The target substance entry suppression structure including the shielding plates 281 and 282 and the side wall member 286 may be replaced with a new structure as needed.

6. Second Embodiment 6.1 Configuration

Figure 7:
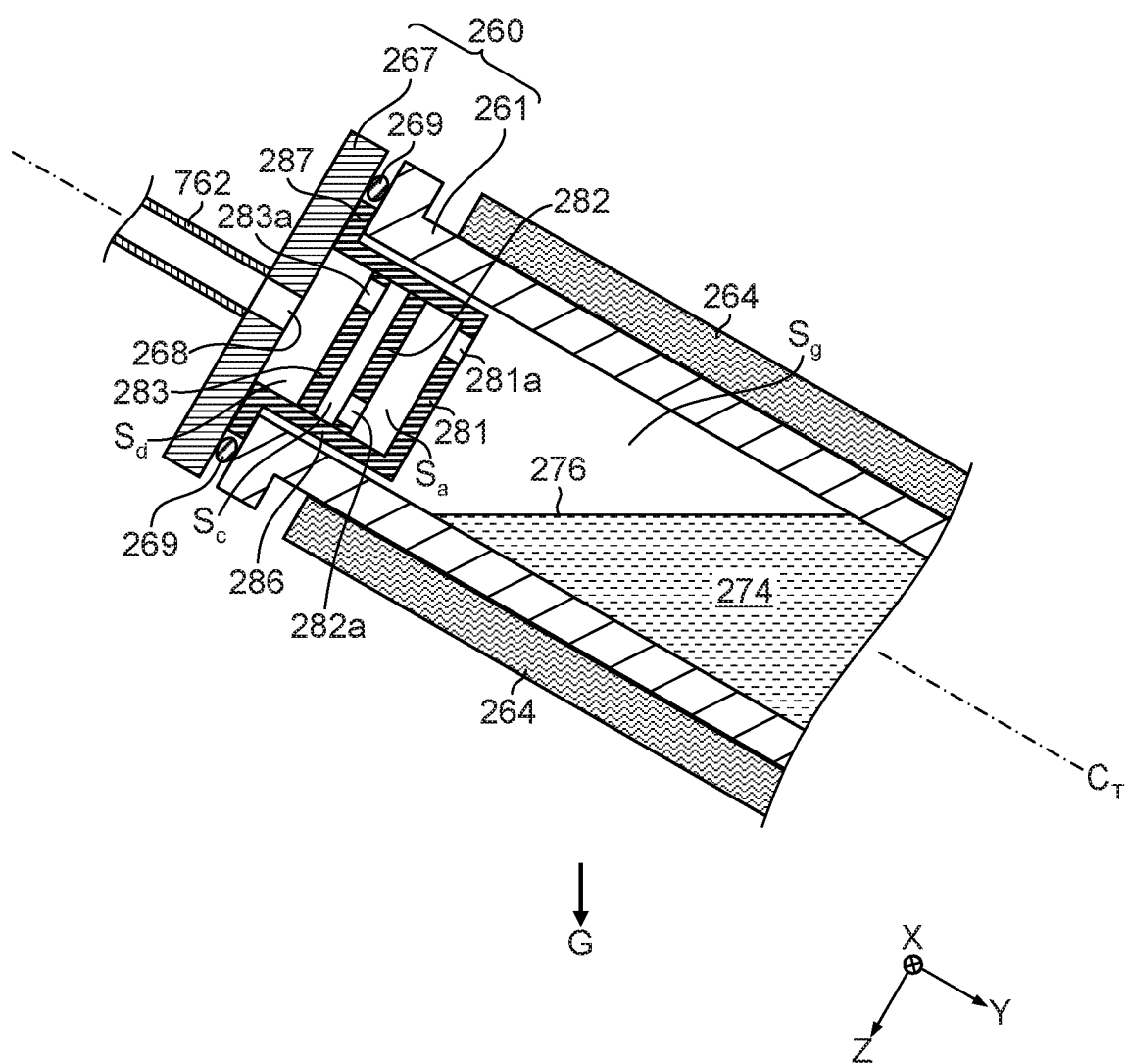
FIG. 7 is a cross-sectional view schematically illustrating a configuration of a part of a target generation device according to a second embodiment.

FIG. 7 is a cross-sectional view schematically illustrating a configuration of a part of a target generation device according to a second embodiment. In the second embodiment, a third shielding plate 283 is added to the configuration of the first embodiment. A through hole 283a of the third shielding plate 283 and the through hole 282a of the second shielding plate 282 are at positions in which one of the through holes 282a and 283a is not seen into the other of the through holes 282a and 283a between the two shielding plates 282 and 283. In the present example, when the two shielding plates 282 and 283 are seen in a plan view from the Y axis direction, the through holes 282a and 283a are arranged at non-overlapping positions in which no portions of the through holes 282a and 283a overlap with each other. When the three shielding plates 281 to 283 are seen in a plan view from the Y axis direction, the through hole 281a of the first shielding plate 281 and the through hole 283a of the third shielding plate 283 may be at positions in which some portions of the through holes 281a and 283a of the shielding plates 281 and 283 overlap with each other.

Further, in the second embodiment, among the three shielding plates 281 to 283, the through hole 283a of the shielding plate 283 that is disposed at a position closest to the gas inlet port 268, and the gas inlet port 268 are arranged at non-overlapping positions in which they do not have an overlapping region in a plan view from the Y axis direction.

The shielding plate 283 is supported by the inner side of the side wall member 286. An inter-shielding plate space $S_c$ is formed between the second shielding plate 282 and the third shielding plate 283. A space formed between the lid 267 and the shielding plate 283 is a most upstream communication space $S_d$.

Figure 8:
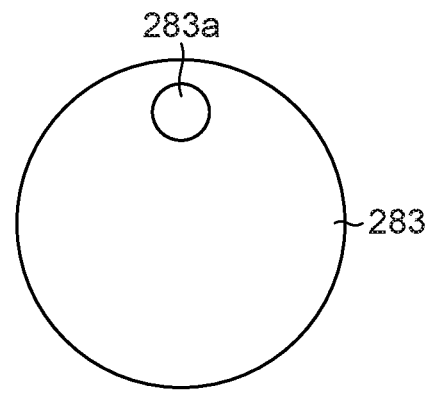
FIG. 8 is a plan view illustrating an example of a shielding plate used in the second embodiment.
Figure 8:
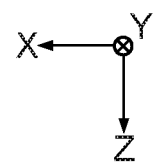

FIG. 8 is a plan view of the shielding plate 283. FIG. 8 is a plan view of the shielding plate 283 seen from the lid 267 side toward the nozzle 262. In FIG. 8, the side wall member 286 is not illustrated. The through holes 283a of the shielding plate 283 may have the same shape as that of the through holes 281a and 282a of the other shielding plates 281 and 282. Alternatively, the through holes 281a, 282a, and 283a may be different in the shape and/or size thereof among the shielding plates. The number of pieces of the through hole 283a provided in the third shielding plate 283 can be designed in one or more appropriate number. In the case where two or more through holes are provided in one shielding plate, the respective through holes may be in the same shape or in different shape and/or size.

It is preferable that the diameter of the through hole 283a is equal to or smaller than the radius of the inner diameter of the tank 260. It is also preferable that the diameter of the through hole 283a has a value larger than the diameter of a small droplet of tin jumped up from the liquid surface 276 of the liquid tin 274 in the tank 260. A specific preferable example of the through hole 283a is a circular through hole having a diameter of 1 millimeter [mm] or larger within a range not larger than the radius of the inner diameter of the tank 260.

6.2 Operation

In the second embodiment illustrated in FIG. 7, a gas passage path from the gas inlet port 268 to the liquid surface 276 of the liquid tin 274 through the through hole 283a, the inter-shielding plate space $S_c$, the through hole 282a, the inter-shielding plate space $S_a$, and the through hole 281a, is a nonlinear communication path. The nonlinear communication path functions as a labyrinth structure that suppresses entry of the tin jumped from the liquid surface 276 of the liquid tin 274 to the gas inlet port 268.

The gas introduced from the gas inlet port 268 into the tank 260 passes through the most upstream communication space $S_d$ between the lid 267 and the shielding plate 283, and then, the through hole 283a, and enters the inter-shielding plate space $S_c$. The gas entering the inter-shielding plate space $S_c$ passes through the through hole 282a and enters the inter-shielding plate space $S_a$, and further passes through the through hole 281a, and may reach the liquid surface 276 of the liquid tin 274. In this way, the gas introduced into the tank 260 is contained in the gas containing space $S_g$. The liquid tin 274 is pressurized by the pressure of the gas filled in the gas containing space $S_g$.

The tin entry suppressing action by the first shielding plate 281 and the second shielding plate 282 is as described in the first embodiment. The second shielding plate 282 suppresses entry of the tin, having passed through the through hole 281a of the first shielding plate 281, into the inter-shielding plate space $S_c$. The third shielding plate 283 further suppresses entry of the slight tin, having passed through the second through hole 282a of the second shielding plate 282, into the gas inlet port 268.

The side wall member 286 suppresses entry of the tin from the side face direction into the inter-shielding plate space $S_c$ and the most upstream communication space $S_d$. The shielding plate 281 in the second embodiment corresponds to a most downstream shielding plate. The shielding plate 283 in the second embodiment corresponds to a most upstream shielding plate.

6.3 Effect

According to the second embodiment, entry of slight tin having passed through the through hole 282a of the second shielding plate 282 to the gas inlet port 268 is also suppressed by the third shielding plate 283. According to the second embodiment, deposition of tin on the lid 267 is hardly observed, so that degradation of function of the seal portion due to corrosion of the seal portion of the joint 730 and clogging of the pipe 762 are not found.

7. Third Embodiment 7.1 Configuration

Figure 9:
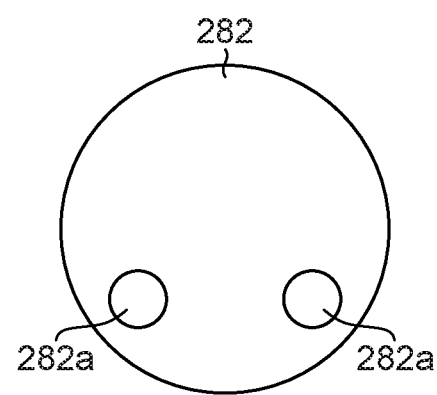
FIG. 9 is a plan view illustrating an example of a shielding plate used in a target generation device according to a third embodiment.
Figure 9:
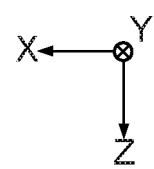

In a target generation device according to a third embodiment, shielding plates 282 and 283 as illustrated in FIGS. 9 and 10 are used, in place of the shielding plates 282 and 283 in the target generation device of the second embodiment.

FIG. 9 is a plan view schematically illustrating a configuration of the shielding plate 282 used in the target generation device of the third embodiment. FIG. 9 is a plan view of the shielding plate 282 seen from the lid 267 side toward the nozzle 262. In FIG. 9, the side wall member 286 is not illustrated.

Figure 10:
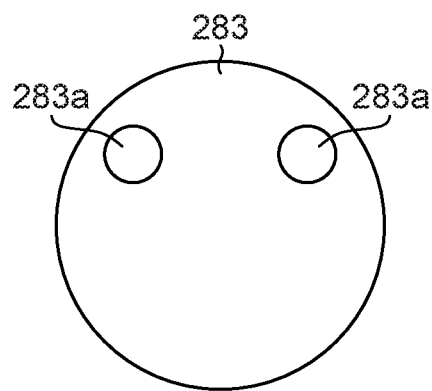
FIG. 10 is a plan view illustrating an example of another shielding plate used in the target generation device according to the third embodiment.
Figure 10:
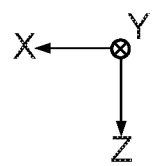

FIG. 10 is a plan view schematically illustrating a configuration of the shielding plate 283 used in the target generation device of the third embodiment. FIG. 10 is a plan view of the shielding plate 283 seen from the lid 267 side toward the nozzle 262. In FIG. 10, the side wall member 286 is not illustrated.

As illustrated in FIG. 9, the shielding plate 282 has a plurality of through holes 282a. Further, as illustrated in FIG. 10, the shielding plate 283 has a plurality of through holes 283a. The respective through holes 282a and 283a of the shielding plates 282 and 283 are provided at positions in which one of the through holes 282a and 283a is not seen into the other of the through holes 282a and 283a between the shielding plates 282 and 283. Among the shielding plates 281 to 283, as for the first shielding plate 281 that is disposed closest to the liquid surface 276, a configuration that is the same as that described in FIG. 5 is adopted.

7.2 Operation

According to the third embodiment, even if a large amount of tin has passed through the through holes 282a of the shielding plate 282, it is possible to suppress clogging of the through holes 282a of the shielding plate 282 by the through holes 282a provided in the shielding plate 282.

Similarly, even if a large amount of tin has passed through the through holes 283a of the shielding plate 283, it is possible to suppress clogging of the through holes 283a of the shielding plate 283 by the through holes 283a provided in the shielding plate 283. The shielding plate 281 may also have a plurality of through holes 281a, similar to the shielding plate 283.

7.3 Effect

According to the third embodiment, the through holes for gas passage of the shielding plates 282 and 283 are less likely to be clogged. Thereby, it is possible to suppress clogging of the gas passage path having a labyrinth structure that leads the gas, having passed through the pipe 762 and introduced from the gas inlet port 268 into the tank 260, to the liquid surface 276 of the liquid tin 274. According to the third embodiment, it is possible to apply appropriate pressure to the liquid tin 274 in the tank 260.

8. Fourth Embodiment 8.1 Configuration

Figure 11:
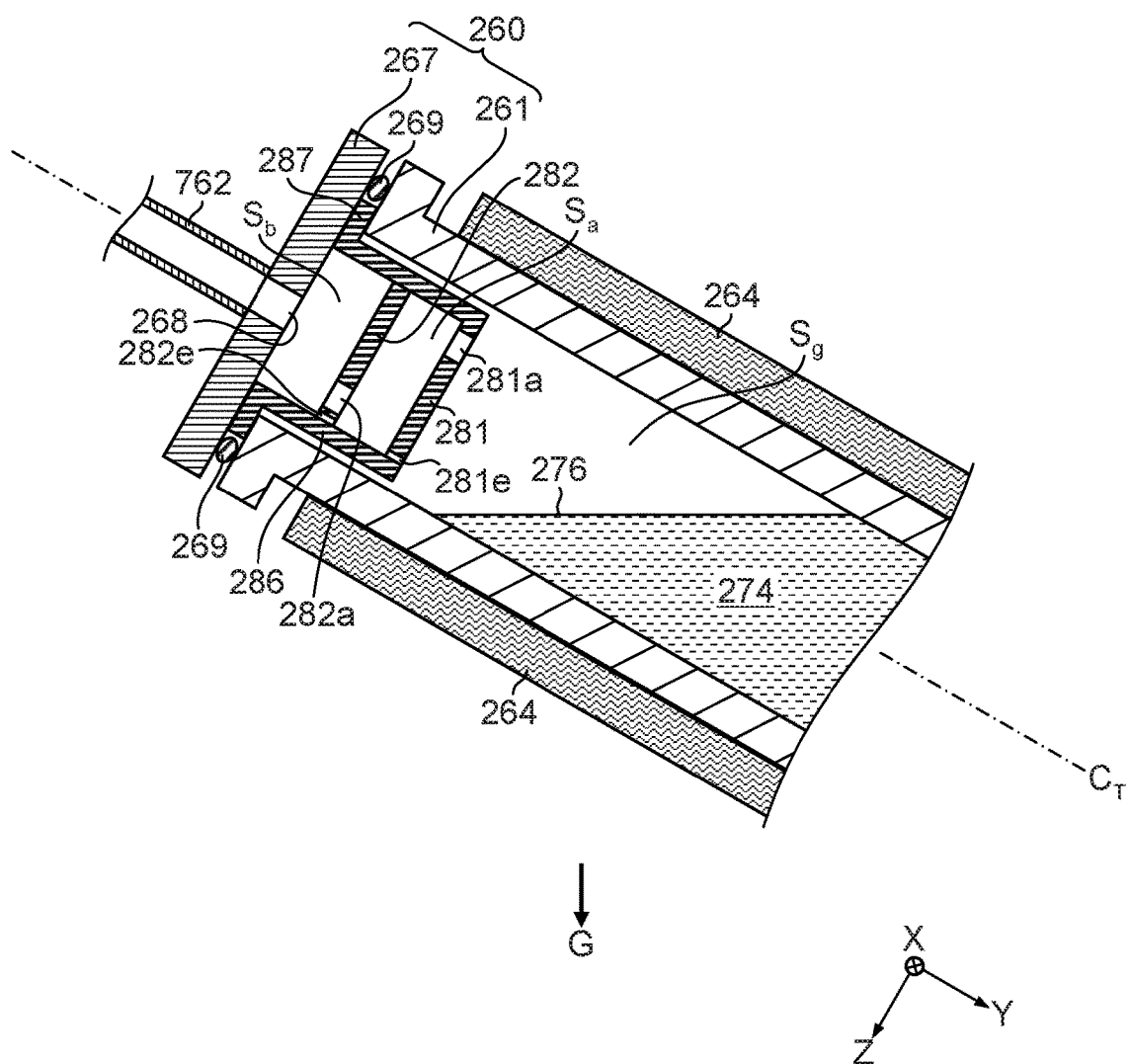
FIG. 11 is a cross-sectional view schematically illustrating a configuration of a part of a target generation device according to a fourth embodiment.

FIG. 11 is a cross-sectional view schematically illustrating a configuration of a part of a target generation device according to a fourth embodiment. The difference between the fourth embodiment and the first embodiment will be described. The fourth embodiment illustrated in FIG. 11 includes a tin discharge hole 281e provided in the shielding plate 281. Moreover, a tin discharge hole 282e is provided in the shielding plate 282.

The tin discharge hole 281e is a hole for discharging tin, which allows the tin having passed through the through hole 281a of the shielding plate 281 to return to the target substance containing space. The shielding plate 281 has the tin discharge hole 281e at a position in a direction that the tin having passed through the through hole 281a flows along the surface of the shielding plate 281 due to the gravity. The tin discharge hole 281e is provided at a position lower than the through hole 281a in a direction toward the plus Z direction from the through hole 281a. The tin discharge hole 281e may be formed at a position including the lowest point position that is the lowest position in the gravity direction on the shielding plate 281.

The tin discharge hole 282e is a hole for discharging tin, which allows the tin having passed through the through hole 282a of the shielding plate 282 to return to the inter-shielding plate space $S_a$. The shielding plate 282 has the tin discharge hole 282e at a position in a direction that the tin having passed through the through hole 282a flows along the surface of the shielding plate 282 due to the gravity. The tin discharge hole 282e is provided at a position lower than the through hole 282a in a direction toward the plus Z direction from the through hole 282a. The tin discharge hole 282e may be formed at a position including a lowest point position which is the lowest position in the gravity direction on the shielding plate 282.

Figure 12:
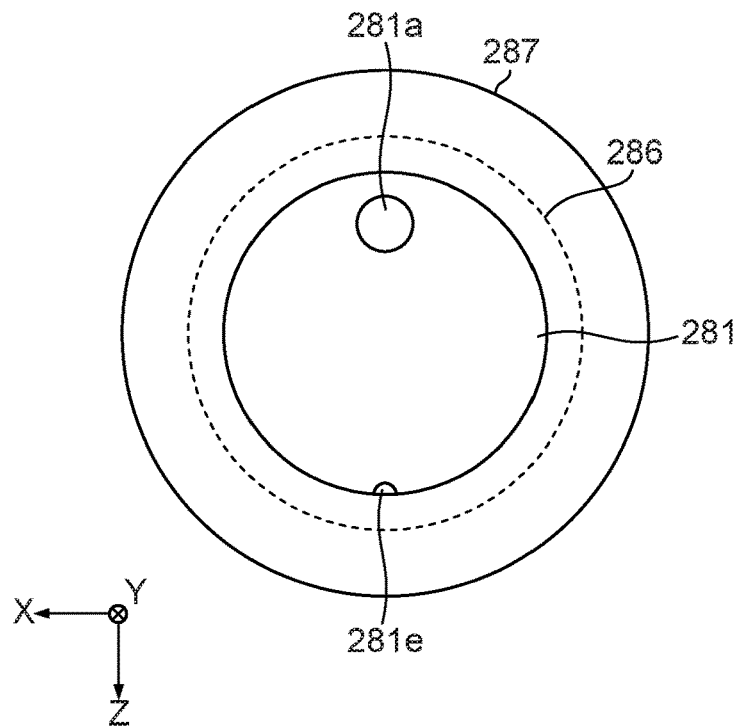
FIG. 12 is a plan view illustrating an example of a shielding plate used in the fourth embodiment.

FIG. 12 is a plan view illustrating the shielding plate 281 used in the fourth embodiment. FIG. 12 is a plan view of the side wall member 286 and the shielding plate 281 seen from the lid 267 side toward the nozzle 262. In FIG. 12, the shielding plate 282 in the vicinity of the lid 267 is not illustrated. As illustrated in FIG. 12, the tin discharge hole 281e is a small hole having a smaller area than that of the through hole 281a for gas passage.

Figure 13:
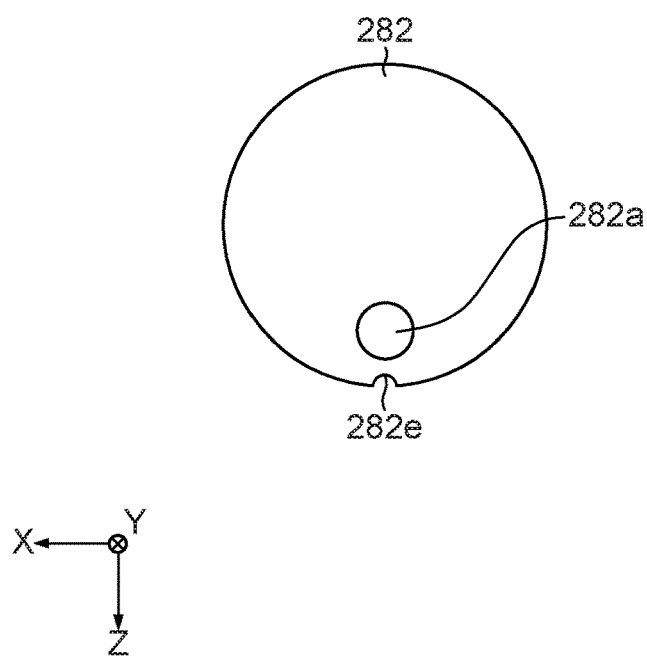
FIG. 13 is a plan view illustrating an example of another shielding plate used in the fourth embodiment.

FIG. 13 is a plan view illustrating the shielding plate 282 used in the fourth embodiment. FIG. 13 is a plan view of the shielding plate 282 seen from the lid 267 side toward the nozzle 262. In FIG. 13, the side wall member 286 is not illustrated. As illustrated in FIG. 13, the shielding plate 282 has a notch in a substantially semicircular shape serving as the tin discharge hole 282e. When the shielding plate 282 is assembled to the side wall member 286, the notch in a substantially semicircular shape of the shielding plate 282 serves as a hole as a tin discharge passage, together with the inner circumferential surface of the side wall member 286. The tin discharge hole 282e is a small hole having a smaller area than that of the through hole 282a for gas passage.

In FIGS. 12 and 13, the tin discharge holes 281e and 282e in a substantially semicircular shape are illustrated as examples. However, the shapes of the tin discharge holes 281e and 282e are not limited to those of FIGS. 12 and 13. The tin discharge holes 281e and 282e may have the same shape, or may have different shapes and/or sizes, respectively.

For example, it is considered that the amount of tin that passes through the through hole 282a of the shielding plate 282 is sufficiently smaller than the amount of tin that passes through the through hole 281a of the shielding plate 281. Accordingly, the tin discharge hole 282e of the shielding plate 282 may be a hole having a smaller area than that of the tin discharge hole 281e of the shielding plate 281.

8.2 Operation

The tin having passed through the through hole 281a of the shielding plate 281 passes through the tin discharge hole 281e and is circulated to the target substance containing space of the tank 260. The tin that further passed through the through hole 282a from the inter-shielding plate space $S_a$ passes through the tin discharge hole 282e and returns to the inter-shielding plate space $S_a$, and then passes through the tin discharge hole 281e and is circulated to the target substance containing space of the tank 260. Each of the tin discharge holes 281e and 282e corresponds to a mode of a target substance discharge hole.

8.3 Effect

According to the fourth embodiment, as the tin discharge holes 281e and 282e are provided in the shielding plates 281 and 282, it is possible to suppress clogging of the gas passage path that may be caused due to retention of the gas, having passed through the through holes 281a and 282a, in the inter-shielding plate space $S_a$. Thereby, it is possible to suppress clogging of the gas passage path having a labyrinth structure that leads the gas, having passed through the pipe 762 and introduced from the gas inlet port 268 into the tank 260, to the liquid surface 276 of the liquid tin 274. According to the fourth embodiment, it is possible to apply appropriate pressure to the liquid tin 274 in the tank 260.

9. Fifth Embodiment

9.1 Configuration

Figure 14:
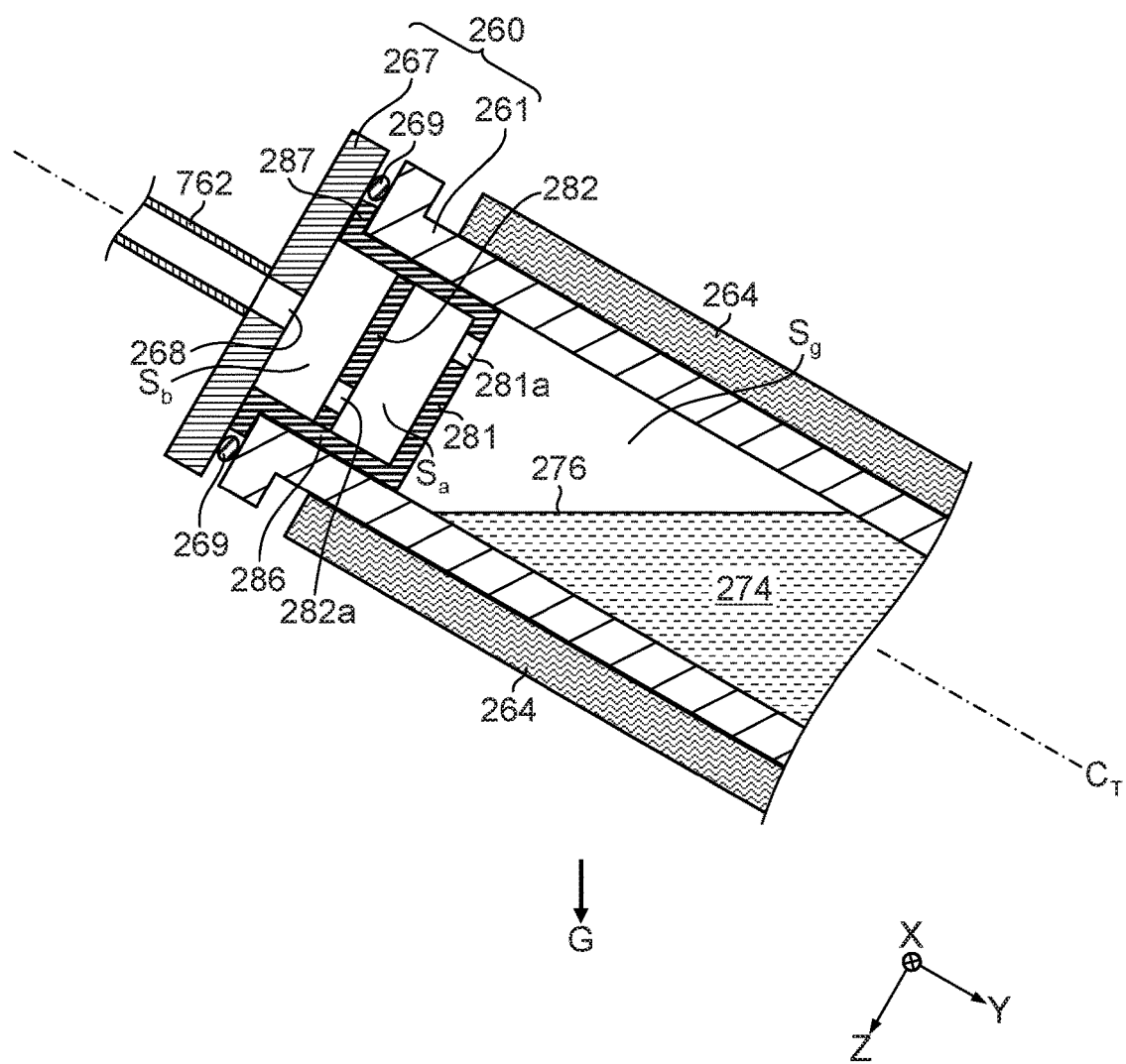
FIG. 14 is a cross-sectional view schematically illustrating a configuration of a part of a target generation device according to a fifth embodiment.

FIG. 14 is a cross-sectional view schematically illustrating a configuration of a part of a target generation device according to a fifth embodiment. The difference between the fifth embodiment illustrated in FIG. 14 and the first embodiment described in FIG. 1 will be described. In the first embodiment, there is a gap between the inner wall surface of the tank 260 and the outer peripheral side surface of the side wall member 286. Meanwhile, in the fifth embodiment, the outer peripheral side surface of the side wall member 286 is in close contact with the inner wall surface of the tank 260. The outer diameter of the side wall member 286 is designed within a range of fitting tolerance with respect to the inner diameter of the tank 260.

9.2 Operation

When the side wall member 286 is closely attached to a tank having a high temperature that is heated by the heater 264, the heat from the heater 264 is efficiently transmitted to the shielding plates 281 and 282. Therefore, it is possible to maintain the shielding plates 281 and 282 at a temperature equal to or higher than the melting point of tin.

9.3 Effect

When the temperature of the shielding plates 281 and 282 is maintained at a temperature equal to or higher than the melting point of tin, even if the tin jumped up from the liquid surface 276 is attached to the shielding plates 281 and 282, it will never be solidified. Therefore, it is possible to suppress clogging of the gas passage path and the tin discharge holes 281e and 282e, which may be caused by solidification of the tin inside the target substance entry suppressing structure including the inter-shielding plate space $S_a$ and the most upstream communication space $S_b$.

In the fifth embodiment, an area in which the tank 260 and the side wall member 286 are in contact with each other increases, compared with the first embodiment. Thereby, heat transfer efficiency to the target substance entry suppressing structure including the shielding plates 281 and 282 can be improved, compared with the first embodiment.

10. Sixth Embodiment

10.1 Configuration

Figure 15:
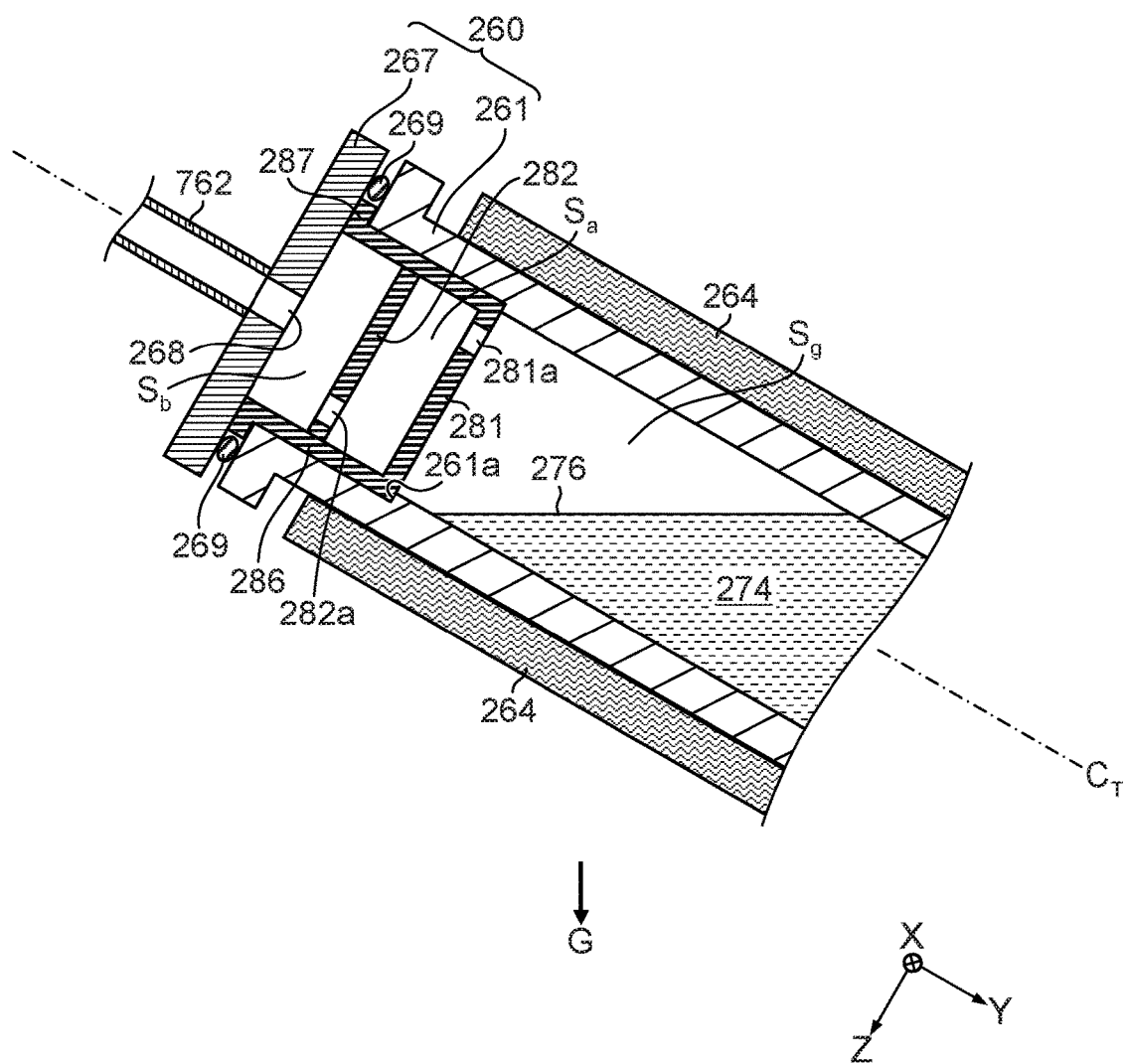
FIG. 15 is a cross-sectional view schematically illustrating a configuration of a part of a target generation device according to a sixth embodiment.

FIG. 15 is a cross-sectional view schematically illustrating a configuration of a part of a target generation device according to a sixth embodiment. The sixth embodiment illustrated in FIG. 15 is a modification of the fifth embodiment illustrated in FIG. 14. In the sixth embodiment, the inner wall of the tank 260 has a fitting portion 261a having a stepped shape to which the side wall member 286 is fitted. The side wall member 286 is inserted to the fitting portion 261a, and is closely attached and fitted to the tank 260.

10.2 Operation

The side wall member 286 is fitted to the fitting portion 261a. The side wall member 286 is disposed in the tank 260 in a state where the outer peripheral side surface thereof is in contact with the inner wall of the tank 260. Other operations of the sixth embodiment are similar to those of the fifth embodiment.

10.3 Effect

In the sixth embodiment, an area in which the tank 260 and the side wall member 286 are in contact with each other further increases, compared with the fifth embodiment. Thereby, the heat transfer efficiency to the target substance entry suppressing structure including the shielding plates 281 and 282 can be improved, compared with the fifth embodiment.

11. Seventh Embodiment

11.1 Configuration

Figure 16:
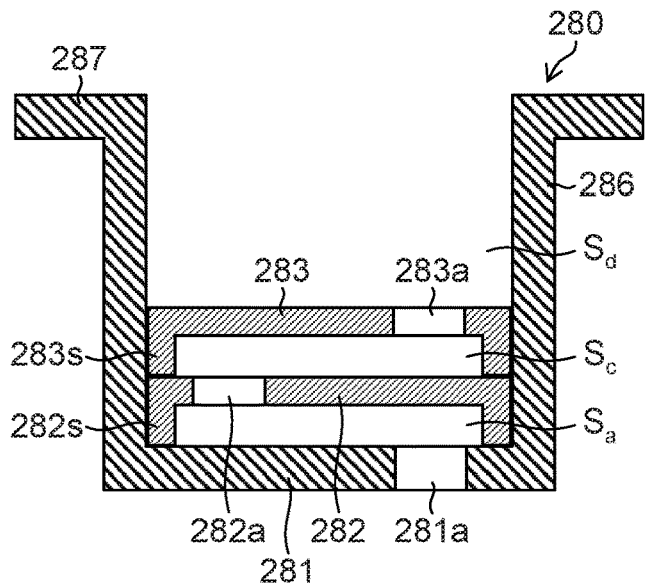
FIG. 16 is a cross-sectional view schematically illustrating a configuration of a target substance entry suppressing structure used in a target generation device according to a seventh embodiment.
Figure 16:
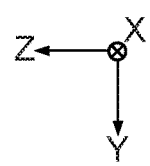

FIG. 16 is a cross-sectional view schematically illustrating a configuration of a target substance entry suppressing structure used in a target generation device according to a seventh embodiment.

A target substance entry suppressing structure 280 includes the side wall member 286, the shielding plate 281, the shielding plate 282, and the shielding plate 283.

The shielding plate 281 is provided at an end portion in the axial direction on the opposite side of the flange portion 287 of the side wall member 286. The shielding plate 281 may be integrally connected to the side wall member 286.

Figure 17:
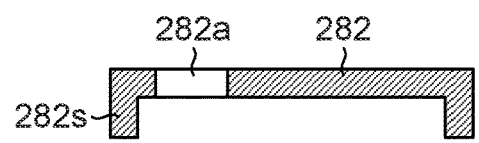
FIG. 17 is a cross-sectional view schematically illustrating a configuration of a spacer-provided shielding plate used in a seventh embodiment.

The shielding plate 282 has a spacer 282s in an annular shape on the peripheral edge of one side surface thereof. The spacer 282s of this example is integrally formed with the shielding plate 282. FIG. 17 is a cross-sectional view of the shielding plate 282. As illustrated in FIG. 17, the shielding plate 282 is a spacer-provided shielding plate provided with the spacer 282s. The shielding plate 282 is disposed so as to be stacked on the shielding plate 281 via the spacer 282s. The spacer 282s is a member that defines the distance between the shielding plate 281 and shielding plate 282. The inter-shielding plate space $S_a$ is secured by the spacer 282s. The spacer 282s covers a side surface portion of the inter-shielding plate space $S_a$. The spacer 282s may be configured as a different component separated from the shielding plate 282.

The shielding plate 283 has the same structure as that of the shielding plate 282. The shielding plate 283 has a spacer 283s in an annular shape on the peripheral edge of one side surface thereof. The spacer 283s may be integrally formed with the shielding plate 283. The shielding plate 283 is disposed so as to be stacked on the shielding plate 282 via the spacer 283s. The spacer 283s is a member that defines the distance between the shielding plate 282 and shielding plate 283. The spacer 283s covers a side surface portion of the inter-shielding plate space $S_c$. The shielding plate 283 may be the same as the spacer-provided shielding plate described in FIG. 17. When the two shielding plates with spacers are stacked, the shielding plates may be disposed while being turned such that the positions of the respective through holes do not overlap. The spacer 282s may be configured as a different component separated from the shielding plate 282.

11.2 Operation

Operations of the seventh embodiment are similar to those of the fifth embodiment. In the configuration illustrated in FIG. 16, it is possible to realize a configuration that is the same as the configuration of the first embodiment by removing the shielding plate 283. Further, by providing a member that is the same as the shielding plate 282 illustrated in FIG. 17 while stacking it on the shielding plate 283 having the configuration illustrated in FIG. 16, it is possible to obtain a target substance entry suppressing structure having four shielding plates.

11.3 Effect

According to the seventh embodiment, assembly of the target substance entry suppressing structure 280 is simple, and it is possible to easily increase or decrease the number of the shielding plates as necessary.

12. Eighth Embodiment 12.1 Configuration

FIG. 17 is a cross-sectional view schematically illustrating a configuration of a shielding plate structure that is a component of a target substance entry suppressing structure used in a target generation device according to an eighth embodiment.

Figure 18:
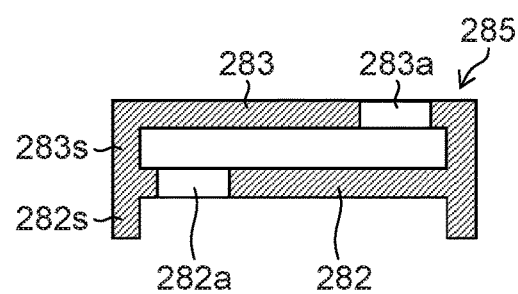
FIG. 18 is a cross-sectional view schematically illustrating a configuration of a shielding plate structure used in a target generation device according to an eighth embodiment.

It is possible to adopt a shielding plate structure 285 of an integrated type as illustrated in FIG. 18, instead of the configuration of the shielding plates 282 and 283 described in FIG. 16. The shielding plate structure 285 is a single structure component in which the spacer 282s, the shielding plate 282, the spacer 283s, and the shielding plate 283 are integrally connected. The shielding plate structure 285 includes two shielding plates 282 and 283 that function as target substance entry suppressing plates.

12.2 Operation

The shielding plate structure 285 illustrated in FIG. 18 can be produced by joining two stacked shielding plates having spacers illustrated in FIG. 17 through welding or the like, for example. Operation of the eighth embodiment is similar to that of the fifth embodiment.

12.3 Effect

According to the eighth embodiment, as a plurality of shielding plates are combined to constitute an integrated shielding plate structure component, it is possible to simplify the assembling work and replacement work.

Further, similar to the configuration illustrated in FIG. 18, a mode of adopting a shielding plate structure in which the shielding plate 281, the spacer 282s, and the shielding plate 282 are integrally connected is also acceptable.

13. Ninth Embodiment 13.1 Configuration

Figure 19:
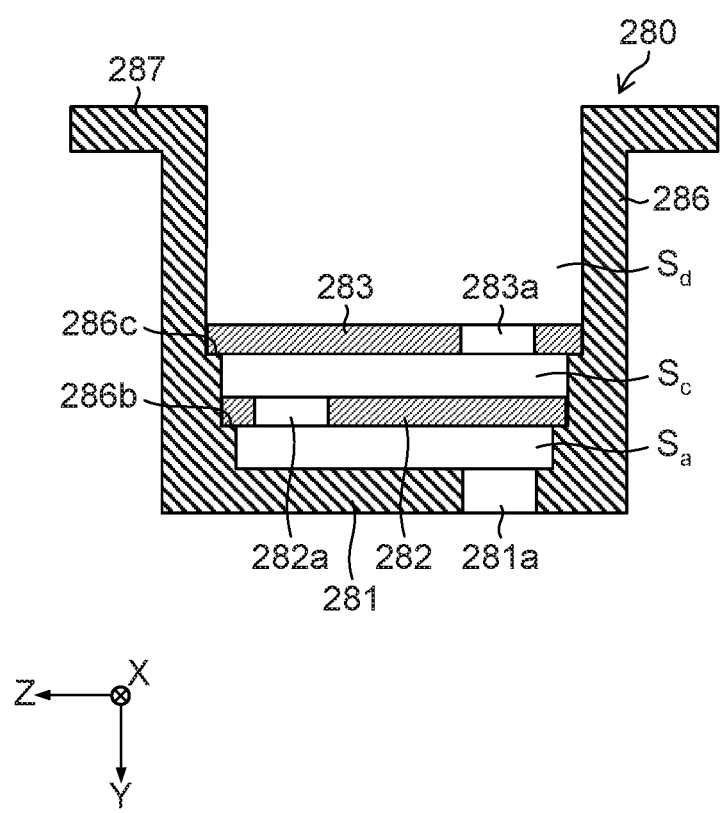
FIG. 19 is a cross-sectional view schematically illustrating a configuration of a target substance entry suppressing structure used in a target generation device according to a ninth embodiment.

FIG. 19 is a cross-sectional view schematically illustrating a configuration of a target substance entry suppressing structure used in a target generation device according to a ninth embodiment. The configuration illustrated in FIG. 19 is adoptable in place of the configuration described in FIG. 17. In a target substance entry suppressing structure 280 illustrated in FIG. 19, the inner wall surface of a side wall member 286 has stepped portions 286b and 286c for mounting the shielding plates 282 and 283. The shielding plate 282 is brought into contact with the stepped portion 286b and is supported by the side wall member 286. The shielding plate 283 is brought into contact with the stepped portion 286c and is supported by the side wall member 286.

13.2 Operation

The shielding plate 282 is inserted from an opening on the flange portion 287 side of the side wall member 286, and is brought into contact with the stepped portion 286b. Similarly, the shielding plate 283 is brought into contact with the stepped portion 286c. With such a structure, the target substance entry suppressing structure 280 having the shielding plates 281 to 283 can be configured.

It is also acceptable to add stepped portions for mounting a larger number of shielding plates, if necessary. Further, in the configuration of FIG. 19, it is also possible to have a mode not including the shielding plate 282, or a mode not including the shielding plate 283.

13.3 Effect

The target substance entry suppressing structure 280 of the ninth embodiment can be assembled easily and can respond to an increase or decrease in the number of shielding plates. In addition, the shielding plates are replaceable.

14. Tenth Embodiment 14.1 Configuration

Figure 20:
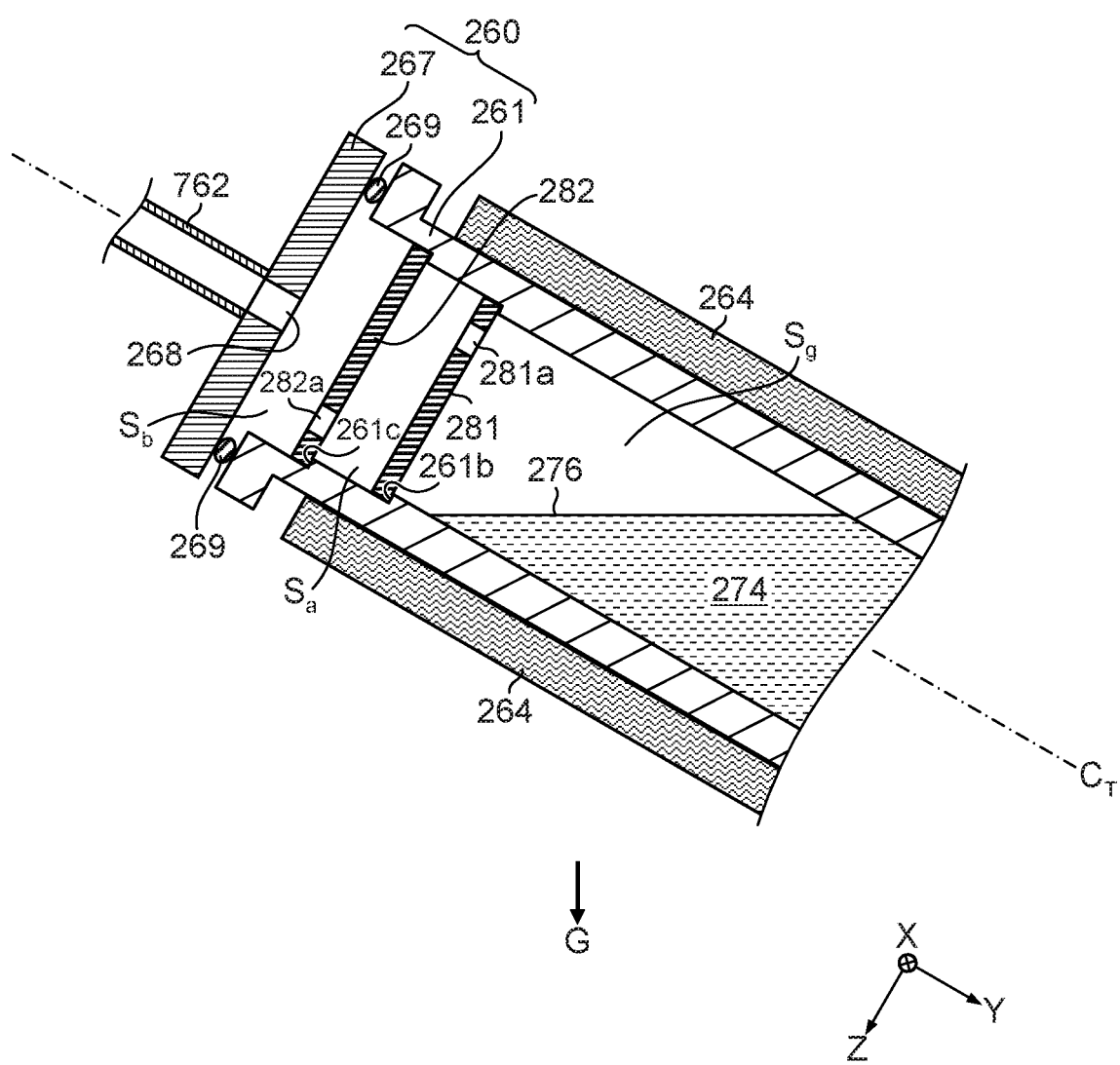
FIG. 20 is a cross-sectional view schematically illustrating a configuration of a part of a target generation device according to a tenth embodiment.

FIG. 20 is a cross-sectional view schematically illustrating a configuration of a part of a target generation device according to a tenth embodiment. Regarding the tenth embodiment, the difference from the first embodiment described in FIG. 4 will be described. In the tenth embodiment illustrated in FIG. 20, the side wall member 286 is omitted, and instead, stepped portions 261b and 261c for mounting the shielding plates 281 and 282 are provided in the tank 260.

The shielding plate 281 is inserted into the tank 260 from the upstream side opening of the tank body 261. The shielding plate 281 is brought into contact with the stepped portion 261b and is supported by the inner wall of the tank 260. Similarly, the shielding plate 282 is brought into contact with the stepped portion 261c and is supported by the inner wall of the tank 260.

14.2 Operation

When the shielding plate 281 is inserted to the stepped portion 261b, the shielding plate 281 is closely attached and fixed to the tank 260. Further, when the shielding plate 282 is inserted to the stepped portion 261c, the shielding plate 282 is closely attached and fixed to the tank 260. As the shielding plates 281 and 282 are directly in contact with the tank 260, heat transfer efficiency is further enhanced as compared with the embodiment using the side wall member 286. Operation of the tenth embodiment is similar to that of the first embodiment.

14.3 Effect

According to the tenth embodiment, the number of components is reduced and entry of the target substance to the gas inlet port 268 can be suppressed with a simpler structure, as compared with the first embodiment.

15. Eleventh Embodiment 15.1 Configuration

Figure 21:
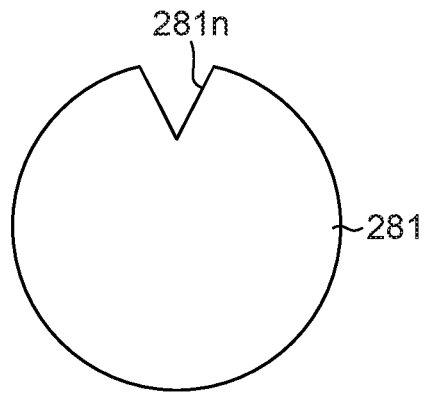
FIG. 21 is a plan view illustrating an example of a shielding plate used in an eleventh embodiment.
Figure 21:
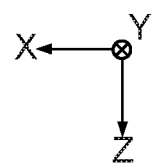
Figure 22:
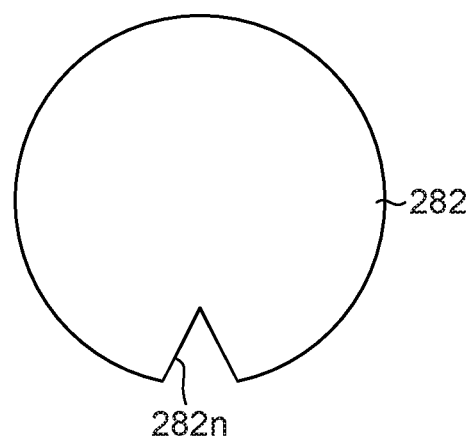
FIG. 22 is a plan view illustrating an example of another shielding plate used in the eleventh embodiment.
Figure 22:
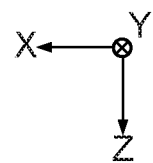

In a target generation device according to an eleventh embodiment, shielding plates 281 and 282 as illustrated in FIGS. 20 and 21 are used, in place of the shielding plates 281 and 282 in the target generation device of the tenth embodiment. The other configurations are the same as those of the tenth embodiments.

FIG. 20 is a plan view schematically illustrating a configuration of the shielding plate 281 used in the target generation device of the eleventh embodiment. FIG. 20 is a plan view of the shielding plate 281 seen from the lid 267 side toward the nozzle 262.

FIG. 21 is a plan view schematically illustrating a configuration of the shielding plate 282 used in the target generation device of the eleventh embodiment. FIG. 21 is a plan view of the shielding plate 282 seen from the lid 267 side toward the nozzle 262.

As illustrated in FIG. 20, the shielding plate 281 has a notch 281n as a non-shielding region for gas passage. Further, as illustrated in FIG. 21, the shielding plate 282 has a notch 282n as a non-shielding region for gas passage. The respective notches 281n and 282n formed in the respective shielding plates 281 and 282 are arranged at positions in which one of the through holes 281a and 282a is not seen into the other of the through holes 281a and 282a between the two shielding plates 281 and 282. The outer diameter of the shielding plate 282 is larger than the outer diameter of the shielding plate 281.

15.2 Operation

The notches 281n and 282n may function as through holes for gas passage. In a state where the shielding plates 281 and 282 are disposed inside the tank 260, the notches 281n and 282n may serve as through holes for allowing the gas to pass through, respectively. The other operations of the eleventh embodiment are the same as those of the ninth embodiment.

15.3 Effect

Even in a mode in which the notches 281n and 282n are formed as in the eleventh embodiment, instead of the through holes 281a and 282a as in the tenth embodiment, the same effect can be achieved.

16. Modifications of Embodiments

[Modification 1] Instead of the through hole for gas passage in the configurations described in the first to ninth embodiments, a notch may be adopted. The shape of the notch is not limited to a substantially triangular shape as illustrated in FIGS. 20 and 21. Various shapes such as a substantially semi-circular shape and a substantially square shape are adoptable. Further, both a through hole and a notch for gas passage may be provided in one shielding plate.

[Modification 2] As a plurality of shielding plates disposed in the tank 260, a shielding plate having a through hole for gas passage and a shielding plate having a notch for gas passage may be used in combination. This means that a plurality of shielding plates may have a configuration including at least one shielding plate having a through hole as a non-shielding region for gas passage. Further, a plurality of shielding plates may have a configuration including at least one shielding plate having a notch as a non-shielding region for gas passage.

[Modification 3] A configuration using three or more shielding plates that function as target substance entry suppressing plates is also possible. In the case of using three or more shielding plates, the positions of the non-shielding regions for gas passage formed in at least two shielding plates thereof may be arranged at position in which one of the non-shielding regions of the two shielding plates is not seen into the other of the non-shielding regions of the two shielding plates between the two shielding plates. When such a condition is satisfied, the shielding plate arranged at the most downstream position and the shielding plate arranged at the most upstream position are arranged at positions not seen through mutually, in the entire three or more shielding plates. This means that a gas passage path between the non-shielding region of the shielding plate arranged at the most downstream position and the non-shielding region of the shielding plate arranged at the most upstream position may be a non-linear communication path, in the entire three or more shielding plates.

[Modification 4] The shielding plates that function as target substance entry suppressing plates disposed inside the tank 260 may have the same or different plate thickness. Further, one shielding plate may be a plate having a uniform thickness or a plate in which the thickness differs depending on the position.

[Modification 5] In the case of providing a tin discharge hole to a spacer-provided shielding plate, the tin discharge hole is formed to penetrate the spacer.

[Modification 6] A plurality of tin discharge holes may be provided in one shielding plate. Further, a tin discharge hole may be provided in only one shielding plate among the shielding plates. For example, a tin discharge hole may be provided only in the most downstream shielding plate disposed at a position farthest from the gas inlet port, among the shielding plates.

[Modification 7] As a modification of the configuration illustrated in FIG. 19, a structure in which the shielding plate 281 is also brought into contact with and fixed to a stepped portion of the side wall member 286, similar to the other shielding plates 282 and 283. It is also possible to form a stepped portion for mounting the shielding plate 281 to the side wall member 286, bring the disk-shaped shielding plate 281 into contact with the stepped portion, and fix the shielding plate 281 to the side wall member 286.

[Modification 8] The distances between adjacent shielding plates, in the case of using three of more shielding plates that function as target substance entry suppressing plates disposed inside the tank 260, may be the same or different.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, the term "including" or "included" should be construed as "not limited to that described to be included". The term "have" should be construed as "not limited to that described to be held". Moreover, the indefinite article "a/an" described in the present description and in the accompanying claims should be construed to mean "at least one" or "one or more".

What is claimed is:

1. An extreme ultraviolet light generation device comprising:
   a chamber in which plasma is generated at an inside of the chamber; and
   a target generation device configured to feed a droplet of a target substance serving as a source of generating the plasma, to the inside of the chamber,
   the droplet having been fed into the chamber by the target generation device being irradiated with laser light and being made into plasma and generating extreme ultraviolet light,
   the target generation device including:
   a tank configured to contain the target substance;
   a heater provided at the tank and configured to melt the target substance;
   a nozzle configured to output the target substance, the nozzle communicating with an inside of the tank;
   a lid having a gas inlet port communicating with the inside of the tank; and
   a plurality of shielding plates disposed inside the tank, the shielding plates being configured to suppress entry of the target substance to the gas inlet port, each of the shielding plates including at least one non-shielding region configured to allow gas to pass through, the non-shielding regions of at least two of the shielding plates being arranged at positions in which one of the non-shielding regions of the at least two of the shielding plates is not seen into the other of the non-shielding regions of the at least two of the shielding plates.

2. The extreme ultraviolet light device according to claim 1, wherein a passage of the gas is formed from the non-shielding region of a most upstream shielding plate that is a shielding plate disposed at a position closest to the gas inlet port among the shielding plates, to the non-shielding region of a most downstream shielding plate that is a shielding plate disposed at a position farthest from the gas inlet port among the shielding plates, via a space formed between the shielding plates, and the passage of the gas is a nonlinear communication path.

3. The extreme ultraviolet light device according to claim 1, further comprising a side wall member in a cylindrical shape, the side wall member surrounding side surfaces of the shielding plates.

4. The extreme ultraviolet light device according to claim 3, wherein the side wall member is disposed in close contact with the tank.

5. The extreme ultraviolet light device according to claim 1, further comprising a spacer provided between the shielding plates.

6. The extreme ultraviolet light device according to claim 5, wherein at least one shielding plate of the shielding plates is a spacer-provided shielding plate in which the spacer is provided.

7. The extreme ultraviolet light device according to claim 1, wherein an inner wall of the tank has a stepped portion for mounting at least one of the shielding plates, and the at least one of the shielding plates is supported by the stepped portion.

8. The extreme ultraviolet light device according to claim 1, wherein an axial direction of the tank formed in a cylindrical shape is inclined obliquely with respect to a gravity direction.

9. The extreme ultraviolet light according to claim 8, wherein the non-shielding region of a most downstream shielding plate disposed at a position farthest from the gas inlet port among the shielding plates is provided at a position higher than a position of a center point of the most downstream shielding plate.

10. The extreme ultraviolet light device according to claim 8, wherein at least one shielding plate among the shielding plates has a target substance discharge hole for discharging the target substance having passed through the non-shielding region.

11. The extreme ultraviolet light device according to claim 10, wherein an area of the target substance discharge hole is smaller than an area of the non-shielding region, and the target substance discharge hole is provided at a position in a direction in which the target substance in a liquid form having passed through the non-shielding region of the at least one shielding plate flows by gravity.

12. The extreme ultraviolet light device according to claim 10, wherein the target substance discharge hole is provided at a lowest position in the at least one shielding plate.

13. The extreme ultraviolet light device according to claim 1, wherein the tank includes a tank body formed in a hollow cylindrical shape, one end in an axial direction of the tank body is closed by the lid, and the other end in the axis direction of the tank body is provided with the nozzle.

14. The extreme ultraviolet light device according to claim 13, wherein the shielding plates are disposed at positions within 30 mm from an inner surface of the lid in the axial direction.

15. The extreme ultraviolet light device according to claim 1, wherein the tank has a liquid surface upper limit position that is a maximum liquid surface height position allowable as a liquid surface height of the target substance in a liquid form contained in the tank, and the shielding plates are disposed at positions between the gas inlet port and the liquid surface upper limit position.

16. The extreme ultraviolet light device according to claim 1, wherein a shielding plate in which the non-shielding region is a through hole is included in the shielding plates.

17. The extreme ultraviolet light device according to claim 16, wherein the through hole as the non-shielding region is a circular hole, and a diameter of the through hole is 1 mm or larger and is equal to or smaller than a radius of an inner diameter of the tank.

18. The extreme ultraviolet light device according to claim 1, wherein a shielding plate in which the non-shielding region is a notch is included in the shielding plates.

19. The extreme ultraviolet light device according to claim 1, wherein the shielding plates are made of a material that is same as a material of the tank.

* * * * *